United States Patent
Hatabu et al.

(10) Patent No.: US 10,680,030 B2
(45) Date of Patent: Jun. 9, 2020

(54) IMAGE SENSING DEVICE HAVING A JUNCTION CAPACITY EXPANSION STRUCTURE

(71) Applicant: SONY SEMICONDUCTOR SOLUTIONS CORPORATION, Kanagawa (JP)

(72) Inventors: Kazuaki Hatabu, Kumamoto (JP); Yukihide Keigo, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/771,516

(22) PCT Filed: Oct. 21, 2016

(86) PCT No.: PCT/JP2016/081239
§ 371 (c)(1),
(2) Date: Apr. 27, 2018

(87) PCT Pub. No.: WO2017/077880
PCT Pub. Date: May 11, 2017

(65) Prior Publication Data
US 2019/0057999 A1   Feb. 21, 2019

(30) Foreign Application Priority Data
Nov. 5, 2015   (JP) .................. 2015-217858

(51) Int. Cl.
*H01L 27/146* (2006.01)
*H01L 27/148* (2006.01)

(52) U.S. Cl.
CPC .... *H01L 27/14641* (2013.01); *H01L 27/1461* (2013.01); *H01L 27/14607* (2013.01); *H01L 27/14643* (2013.01); *H01L 27/14812* (2013.01)

(58) Field of Classification Search
CPC .................. H01L 27/14806–14812; H01L 27/14603–14607; H01L 27/1461;
(Continued)

(56) References Cited

U.S. PATENT DOCUMENTS

2001/0006237 A1* 7/2001 Abe ................ H01L 27/14601
257/215
2001/0054726 A1* 12/2001 Abe ................ H01L 27/14812
257/292
(Continued)

FOREIGN PATENT DOCUMENTS

JP   2005-332925   12/2005

OTHER PUBLICATIONS

Machine translation of IDS reference JP2005332925 (Dec. 2, 2005).*
(Continued)

*Primary Examiner* — Younes Boulghassoul
(74) *Attorney, Agent, or Firm* — Sheridan Ross P.C.

(57) ABSTRACT

An imaging device comprises a first pixel disposed in a substrate. The first pixel may include a first material disposed in the substrate, and a second material disposed in the substrate. A first region of the first material, a second region of the first material, and a third region of the second material form at least one junction. A first lateral cross section of the substrate intersects the at least one junction, and a second lateral cross section of the substrate intersects at least one fourth region of the first material.

19 Claims, 34 Drawing Sheets

(58) Field of Classification Search
CPC ......... H01L 27/14641; H01L 27/14831; H01L 27/14607; H01L 27/14812
See application file for complete search history.

(56) References Cited

U.S. PATENT DOCUMENTS

| | | | |
|---|---|---|---|
| 2005/0064613 A1* | 3/2005 | Takeuchi | H01L 27/14812 438/24 |
| 2008/0197436 A1* | 8/2008 | Uya | H01L 27/0694 257/432 |
| 2010/0002108 A1* | 1/2010 | Mabuchi | H01L 27/14603 348/294 |
| 2011/0298078 A1* | 12/2011 | Ha | H01L 27/14616 257/443 |
| 2013/0175582 A1* | 7/2013 | Ihara | H01L 27/1461 257/222 |
| 2014/0367747 A1 | 12/2014 | Watanabe | |
| 2015/0048474 A1* | 2/2015 | Ishiwata | H01L 27/14603 257/443 |
| 2016/0020237 A1* | 1/2016 | Yamakawa | H04N 5/374 257/233 |
| 2016/0268322 A1* | 9/2016 | Watanabe | H01L 27/14614 |
| 2016/0329365 A1* | 11/2016 | Tekleab | H01L 27/1463 |
| 2017/0201705 A1* | 7/2017 | Ishiwata | H01L 27/14641 |
| 2019/0259801 A1* | 8/2019 | Seto | H01L 27/14603 |

OTHER PUBLICATIONS

International Search Report and Written Opinion prepared by the European Patent Office dated Jan. 18, 2017, for International Application No. PCT/JP2016/08239.

\* cited by examiner

FIG. 30
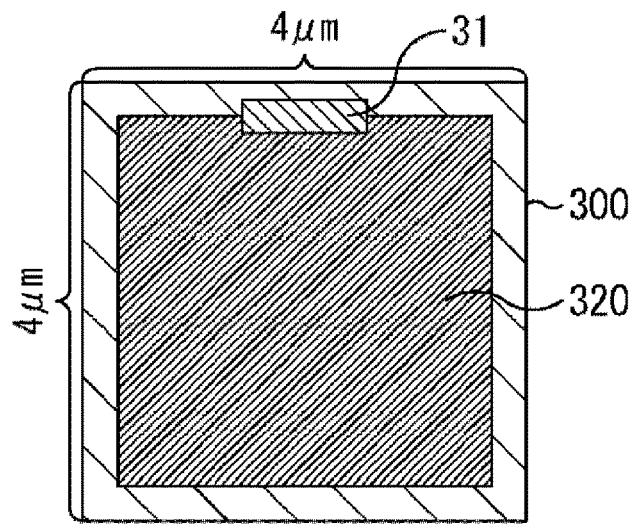
A
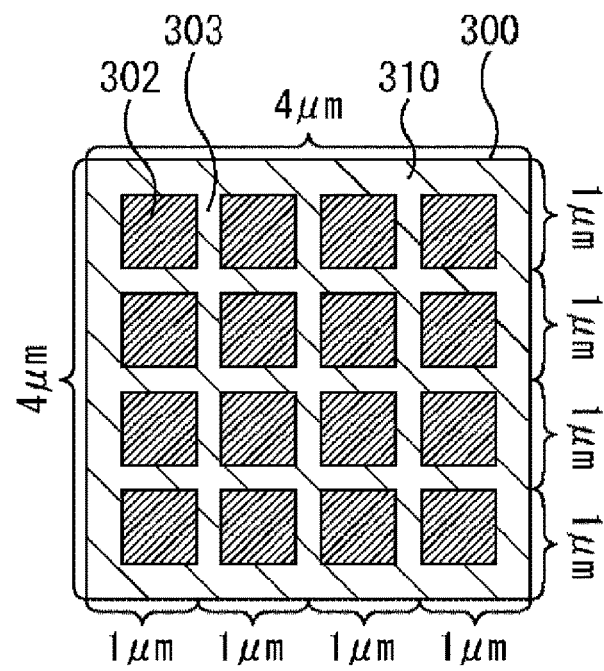
B

IMAGE SENSING DEVICE HAVING A JUNCTION CAPACITY EXPANSION STRUCTURE

CROSS REFERENCE TO RELATED APPLICATIONS

This application claims is a national stage application under 35 U.S.C. 371 and claims the benefit of PCT Application NO. PCT/JP2016/081239 having an international filing date of 21 Oct. 2016, which designated the United States, which PCT application claimed the benefit of Japanese Priority Patent Application JP 2015-217858 filed on Nov. 5, 2015, the disclosures of each of which are incorporated herein by reference.

TECHNICAL FIELD

The present technology relates to an image sensing device and/or pixel in an imaging device. More particularly, the present technology relates to an image sensing device and/or pixel in an imaging device that improves a saturated signal electric charge quantity.

BACKGROUND ART

A CCD (Charge-Coupled Device) image sensor is an image sensor that arranges two-dimensionally photoelectric conversion devices (e.g., photodiodes) corresponding to pixels, and reads out signals of respective pixels that are electric charges provided by the photoelectric conversion devices using a vertical transfer CCD and/or a horizontal transfer CCD.

On the other hand, a CMOS (complementary metal-oxide-semiconductor) image sensor is similar to the CCD image sensor in that the photoelectric conversion devices corresponding to pixels are two-dimensionally arranged, but does not readout signals using the vertical and horizontal transfer CCDs, and instead reads out the signals stored per pixel from the pixels selected using selection lines configured of aluminum, copper wire, etc. like a memory device.

As described above, the CCD image sensor and the CMOS image sensor are different in many points such as a readout method, but are common to have photodiodes.

A maximum value of a signal electric charge quantity accumulated on the photoelectric conversion devices is referred to as a saturated signal electric charge quantity (Qs). An image sensor having a high saturated signal electric charge quantity has improved dynamic range and signal to noise (SN) ratio. Accordingly, an increase of the saturated signal electric charge quantity is a desirable property improvement of the image sensor. As a method of increasing the saturated signal electric charge quantity, it is conceivable that an area of the photodiode is increased, or that a PN junction capacity of the photodiode is increased.

Patent Literature 1 suggests an image sensing device that can provide high sensitivity by increasing a saturated signal electric charge quantity without increasing an area of a photoelectric conversion device and an impurity concentration.

CITATION LIST

Patent Literature

PTL 1: Japanese Patent Application Laid-open No. 2005-332925

SUMMARY OF INVENTION

Technical Problem

As described above, as the method of increasing the saturated signal electric charge quantity, it is conceivable that an area of the photodiode is increased, or a PN junction capacity of the photodiode is increased.

However, if the area of the photodiode is increased, a total pixel number in the image sensor may be undesirably decreased because of the increase in the area of the photodiode at the same angle of view. In addition, in order to increase the PN junction capacity of the photodiode, the concentration in a P type region and an N type region is increased, and as a result a dark current is also increased. Therefore, there is a limit to increasing the PN junction capacity.

Also, Patent Literature 1 shows a technology that a PN junction capacity expansion part is elongated successively from a surface side of a substrate to a depth direction of the substrate to increase the saturated signal electric charge. However, an arrangement of a readout electrode may be limited, or it may be difficult to select a suitable pattern for a PN junction expansion in order to give priority to readout signals.

In view of the circumstances as described above, it is desired to increase a saturated signal electric charge quantity.

Solution to Problem

According to an embodiment of the present technology, there is provided an image sensing device (e.g., pixel in an imaging device), including a first P type impurity region; a first N type impurity region; and a capacity expansion part including a second P type impurity region, a second N type impurity region, and a PN junction surface, the second P type impurity region and the second N type impurity region forming the PN junction surface, the first P type impurity region, the first N type impurity region and the capacity expansion part being disposed from an upper surface of a semiconductor substrate in a depth direction.

The image sensing device further includes a readout electrode that reads out an accumulated electric charge on one surface opposite to the other surface of the first P type impurity region closer to the second N type impurity region than the one surface, in which the distance between the capacity expansion part and the readout electrode is larger than the distance between the capacity expansion part and the first N type impurity region.

The capacity expansion part may include second P type impurity regions and second N type impurity regions, the second P type impurity regions and the second N type impurity regions being alternately disposed.

The semiconductor substrate may be made of silicon, and the second P type impurity region may be formed of a material that fills an interface with silicon with holes by a work function difference.

The first P type impurity region and the second P type impurity region may be layers disposed in different directions.

The first N type impurity region and the second N type impurity region may be layers disposed in different directions.

The first N type impurity region may be configured of an N+ region having a high concentration and an N− region having a low concentration.

The first N type impurity region may be the N− region having a low concentration.

A potential gradient may be provided from the capacity expansion part to the readout electrode for reading out the electric charge.

The second N type impurity region in the capacity expansion part may be formed square in a cross-section viewed from a predetermined (or alternatively, desired) direction.

The second P type impurity region in the capacity expansion part may be formed curve having a predetermined (or alternatively, desired) width in a cross-section viewed from a predetermined (or alternatively, desired) direction.

The second P type impurity region in the capacity expansion part may be formed circle having a predetermined (or alternatively, desired) width in a cross-section viewed from a predetermined (or alternatively, desired) direction.

A repeat distance of the second P type impurity region and the second N type impurity region in the capacity expansion part may be 1 μm or less.

A plurality of the image sensing devices may share a floating diffusion, and the readout electrode may be disposed near the floating diffusion.

The image sensing device according to an embodiment of the present technology includes a first P type impurity region; a first N type impurity region; and a capacity expansion part including a second P type impurity region, a second N type impurity region, and a PN junction surface, the second P type impurity region and the second N type impurity region forming the PN junction surface, the first P type impurity region, the first N type impurity region and the capacity expansion part being disposed from an upper surface of a semiconductor substrate in a depth direction.

Advantageous Effects of Invention

According to an embodiment of the present technology, a saturated signal electric charge quantity can be increased.

It should be noted that the effect described here is not necessarily limitative and may be any effect described in the present technology.

BRIEF DESCRIPTION OF DRAWINGS

FIG. 30 is a view for explaining a size of a pixel having a PN junction capacity expansion part.

DESCRIPTION OF EMBODIMENTS

Hereinafter, embodiments of the present technology will be described with reference to the drawings.

The embodiments of the present technology will be described in the following order.

1. Structure of Image Sensing Device (Related Art)

2. Structure of Image Sensing Device

3. Shape of N+ Region in PN Junction Capacity Expansion Part
4. Improvement of Saturated Signal Electric Charge Quantity
5. Another structure of Image Sensing Device
6. Sharing pixels
7. Example Use of Image Sensing Device The present technology described below is applicable to an image sensing device, for example, a CCD image sensor or a CMOS image sensor. Here, such an image sensing device will be described as an example. By applying the present technology described below, it can increase a saturated signal electric charge quantity (Qs) that is a maximum value of a signal electric charge quantity accumulated on the image sensing device (photoelectric conversion device (photodiode)).

For describing the image sensing device to which the present technology is applied providing the effect, an image sensing device in the related art will be described briefly for comparison.

<Structure of Image Sensing Device (Related Art)>

Figure 1:
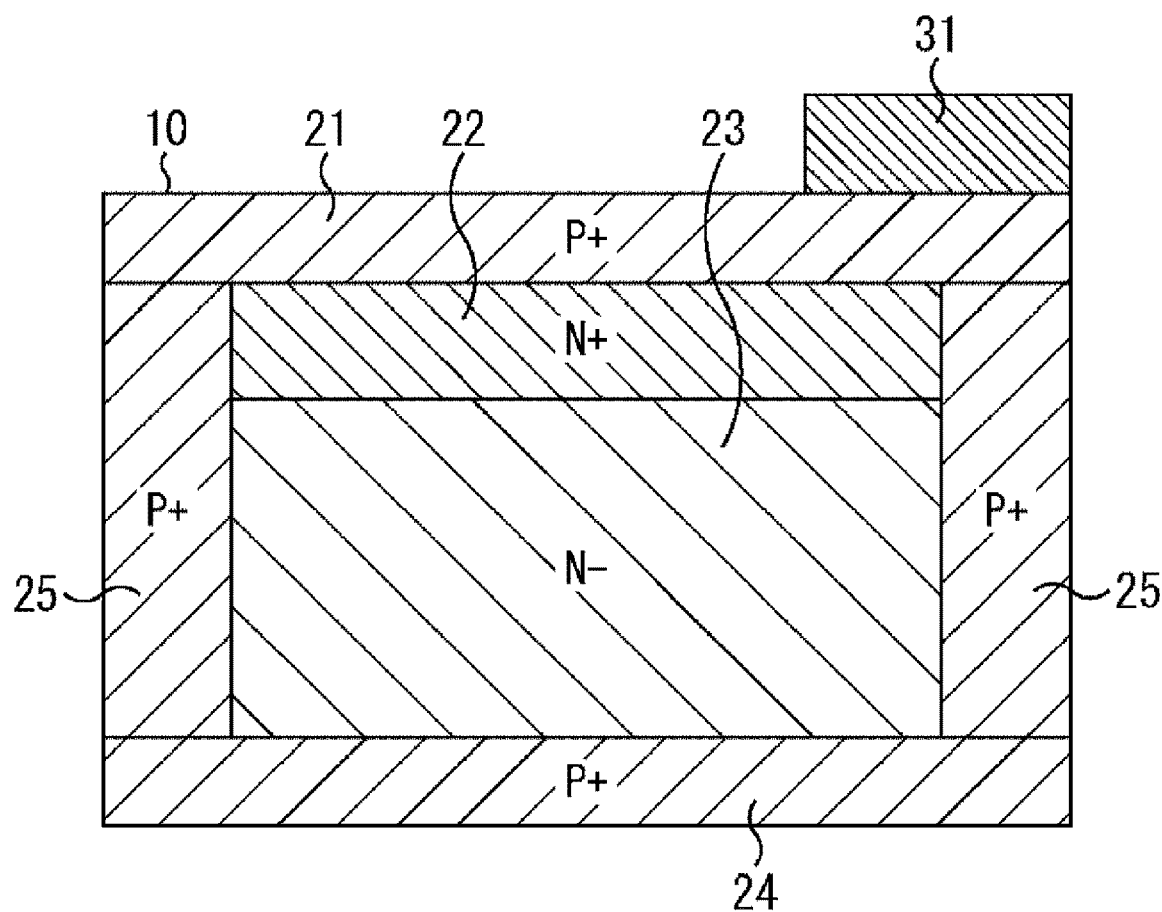
FIG. 1 is a view showing an example of a configuration of an image sensing device.

FIG. 1 is a view showing an example of a configuration of an image sensing device. An image sensing device or pixel 10 has a structure where respective impurity regions, i.e., a P+ region 21, an N+ region 22, an N− region 23, and a P+ region 24, are se-quentially formed in a depth direction at an upper surface of a silicon substrate, and P+ regions 25 are formed at side surfaces.

In FIG. 1 and the following description, "+" and "−" notations represent that an impurity concentration is higher or lower than that in other regions.

Once light is incident on the image sensing device 10 having such a structure, an electron-hole pair is generated, and a signal electric charge (electron) is accumulated on junction parts of the P type (or p-type) region and the N type (or n-type) region. A readout electrode 31 for reading out the electric charge accumulated is provided at an upper surface of the P+ region 21 in the image sensing device 10 shown in FIG. 1.

Figure 2:
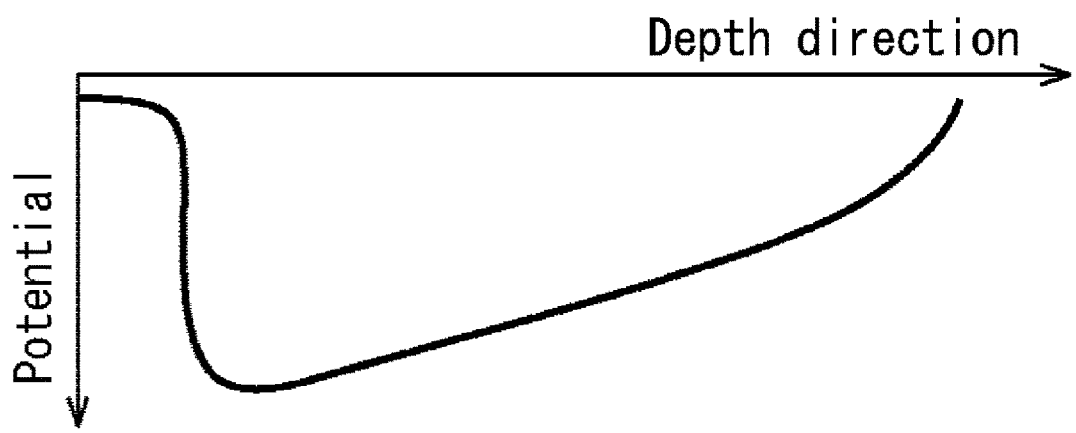
FIG. 2 is a diagram showing a relationship between a depth and a potential.

FIG. 2 shows a relationship between a depth and a potential in the image sensing device 10 having the structure shown in FIG. 1. In FIG. 2, a horizontal axis represents a depth from an upper surface of the image sensing device 10 (an upper surface of the P+ region 21), and a vertical axis represents a negative potential. In FIG. 2, the greater a value in the vertical axis (the lower the negative potential) is, the greater a potential of an electron is, and the lower a potential of a hole is.

In the following description, the image sensing device 10 having the structure shown in FIG. 1 and a potential status shown in FIG. 2 is used as a reference. A difference from the image sensing device 10 as a reference and a change in potential are described.

Figure 3:
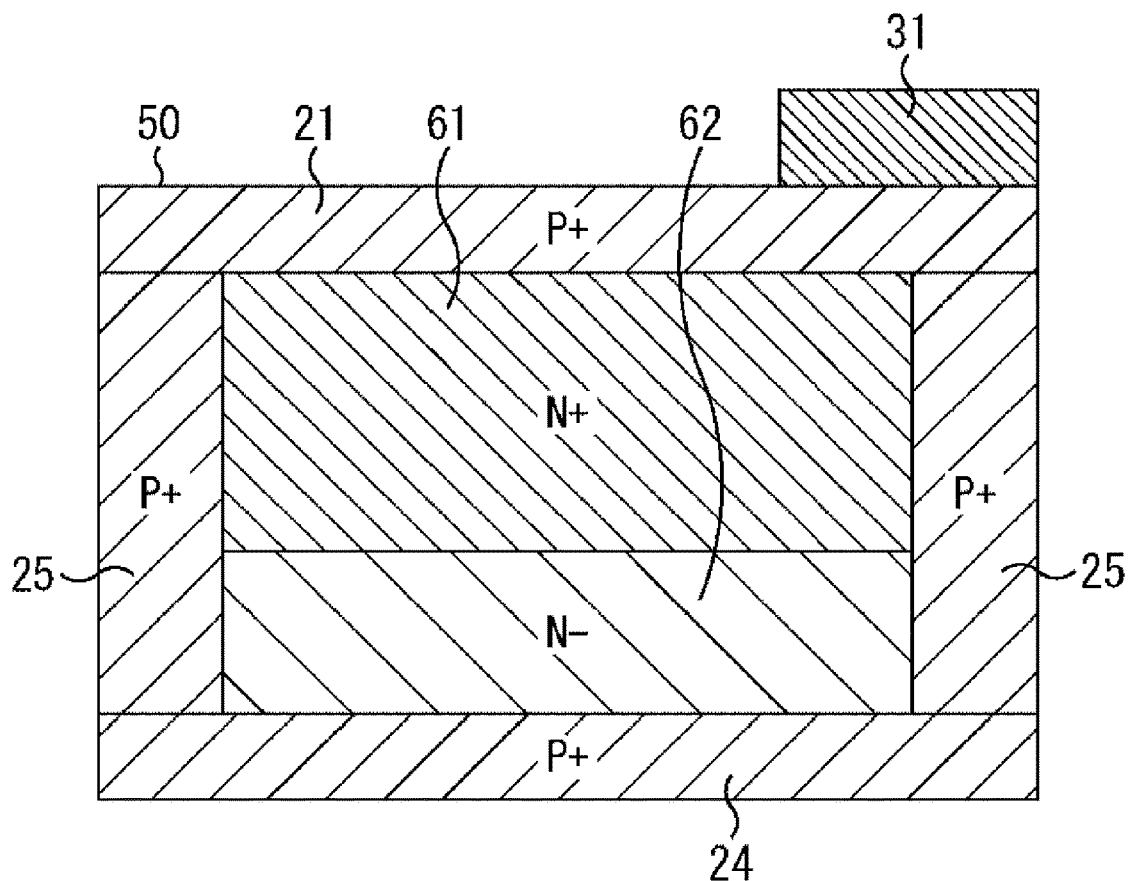
FIG. 3 is a view showing an example of a configuration of an image sensing device.
Figure 5:
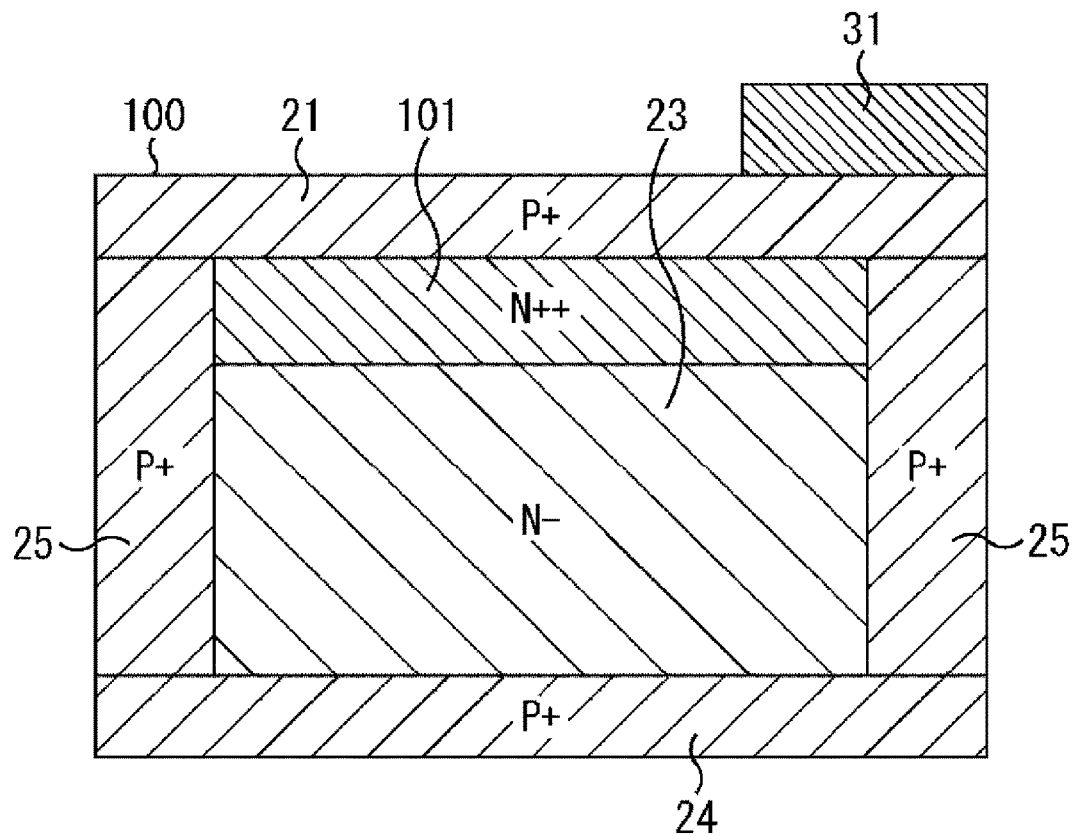
FIG. 5 is a view showing an example of a configuration of an image sensing device.
Figure 7:
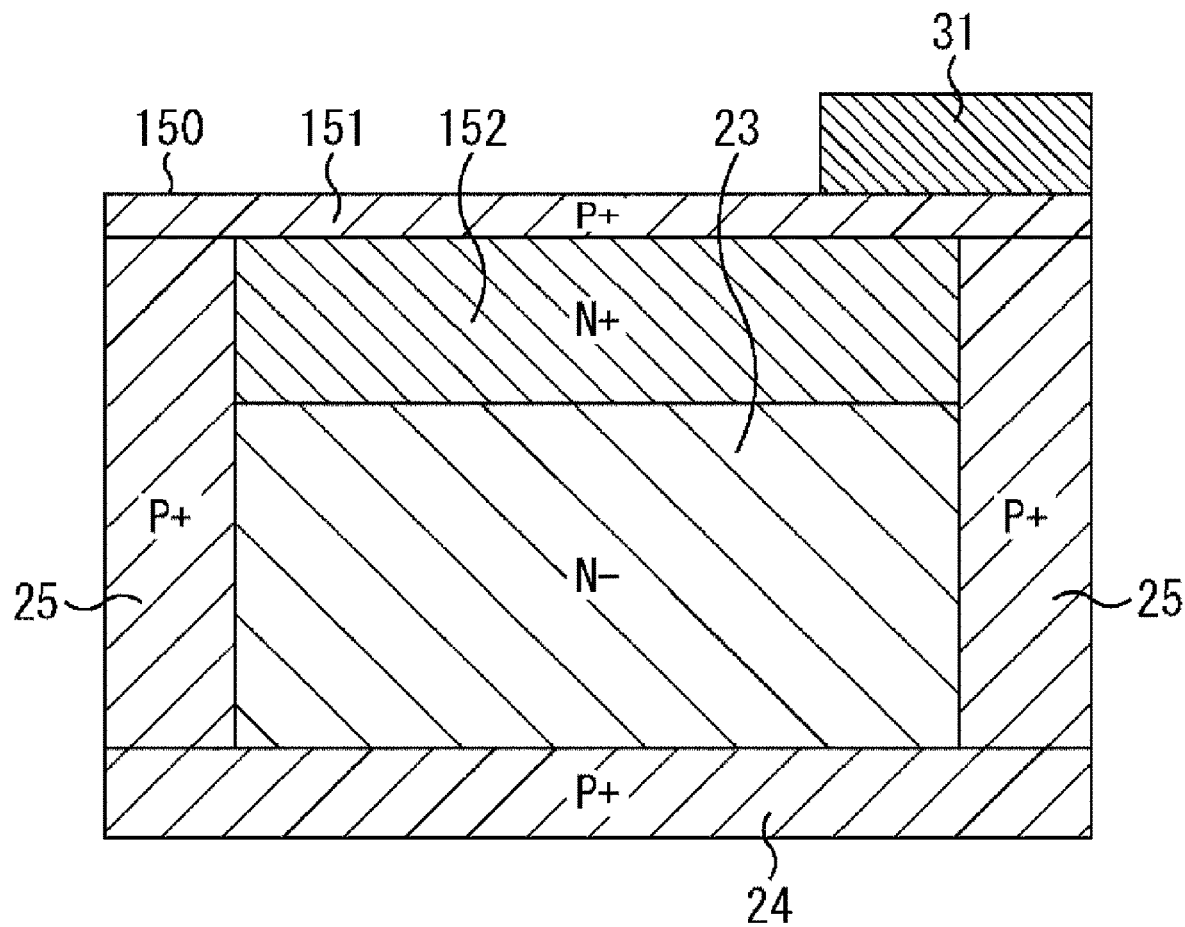
FIG. 7 is a view showing an example of a configuration of an image sensing device.

FIG. 3, FIG. 5, and FIG. 7 each is a view showing an example of an image sensing device in the related art having a structure for increasing a saturated signal electric charge quantity (Qs) with respect to the image sensing device 10 shown in FIG. 1. In the following description, parts having a similar configuration of the image sensing device 10 shown in FIG. 1 are denoted by the same reference numerals, and thus detailed description thereof will be hereinafter omitted.

An image sensing device or pixel 50 shown in FIG. 3 has a structure that an N+ region 22 of the image sensing device 10 shown in FIG. 1 is enlarged (deeper). An N+ region 61 of the image sensing device 50 is provided deeper than the N+ region 22 of the image sensing device 10 (FIG. 1).

Figure 4:
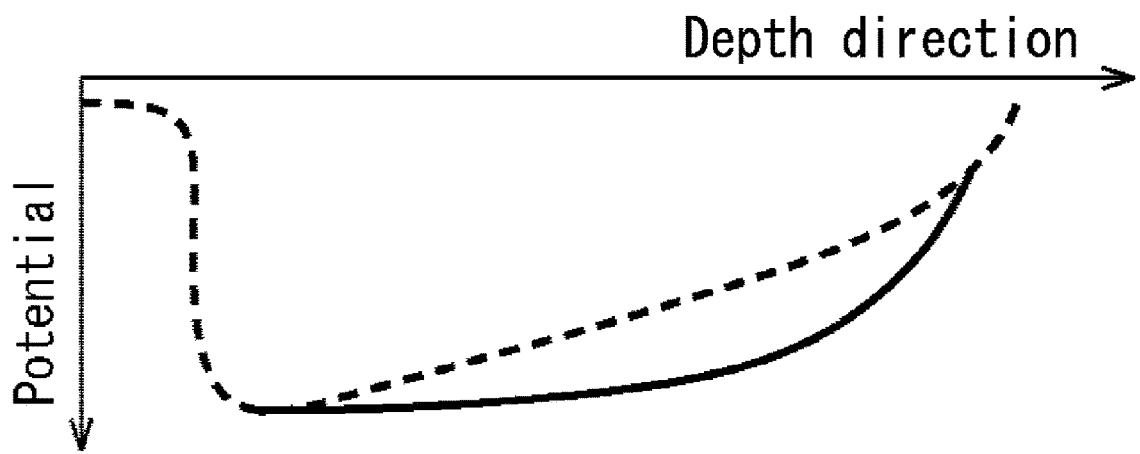
FIG. 4 is a diagram showing a relationship between a depth and a potential.

FIG. 4 is a diagram showing a relationship between a depth and a potential of the image sensing device 50 having the structure shown in FIG. 3. In FIG. 4, a dotted line represents the potential status of the image sensing device 10 shown in FIG. 2 by a solid line, and a solid line represents a potential status of the image sensing device 50.

As in the image sensing device 50, when the N+ region 61 is deep, a potential in a deep part of bulk is deepened to add capacity. As shown in FIG. 4, when the capacity is added, a status that the negative potential is low (a peak status) can be maintained in the depth direction, thereby increasing the saturated signal electric charge quantity (Qs).

However, in this case, as an electric field in an image sensor may be short or a barrier may be generated, and thus, all signals may not be readout when a readout gate is turned on (ON).

FIG. 5 is a view showing an another configuration of an image sensing device. An image sensing device or pixel 100 shown in FIG. 5 has a structure that the N+ region 22 of the image sensing device 10 shown in FIG. 1 has a high impurity concentration. An N++ region 101 of the image sensing device 100 has an impurity concentration higher than the N+ region 22 of the image sensing device 10 (FIG. 1).

Figure 6:
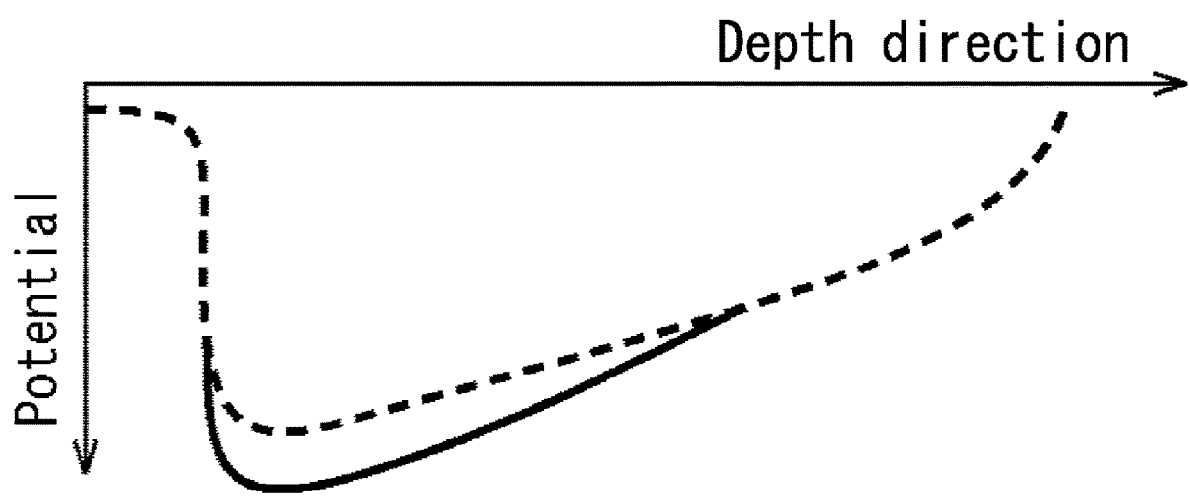
FIG. 6 is a diagram showing a relationship between a depth and a potential.

FIG. 6 is a diagram showing a relationship between a depth and a potential of the image sensing device 100 having the structure shown in FIG. 5. In FIG. 5, a dotted line represents the potential status of the image sensing device 10 shown in FIG. 2 by a solid line, and a solid line represents a potential status of the image sensing device 100.

As in the image sensing device 100, when the N++ region 101 junctured with the P+ region 21 has the high impurity concentration, the surface of the image sensor may be deeper, and a capacity may be added to the surface. As shown in FIG. 6, when the capacity is added, a status that the negative potential at a peak may be higher, thereby increasing the saturated signal electric charge quantity (Qs).

However, a readout voltage should be higher, thereby generating a readout failure or degrading a white spot.

FIG. 7 is a view showing an example of a configuration of another image sensing device. An image sensing device or pixel 150 shown in FIG. 7 has a structure where the P+ region 21 is thin (shallow) and the N+ region 22 is thick (deep) of the image sensing device 10 shown in FIG. 1 as a reference. A P+ region 151 of the image sensing device 150 is thinner (shallower) than the P+ region 21 of the image sensing device 10 (FIG. 1), and a N+ region 152 of the image sensing device 150 is thicker (deeper) than the N+ region 22 of the image sensing device 10 (FIG. 1).

Figure 8:
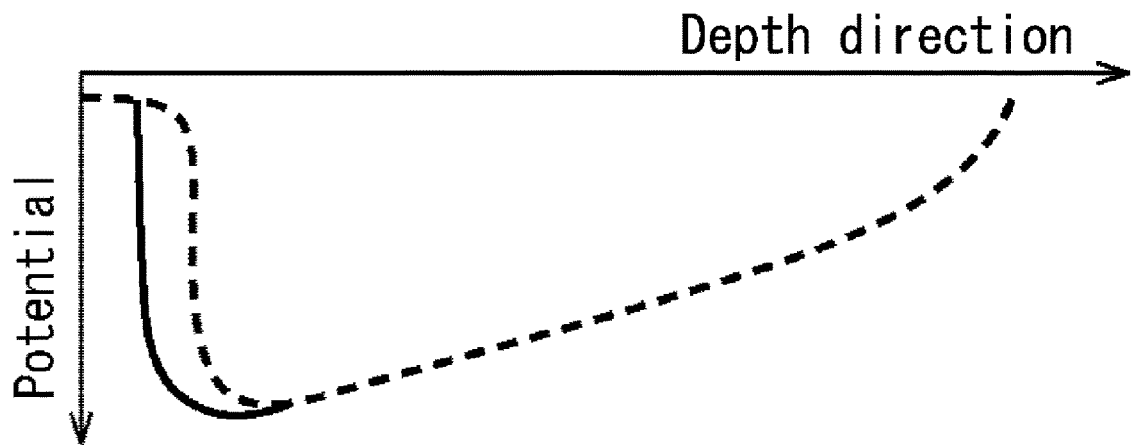
FIG. 8 is a diagram showing a relationship between a depth and a potential.

FIG. 8 is a diagram showing a relationship between a depth and a potential of the image sensing device 150 having the structure shown in FIG. 7. In FIG. 8, a dotted line represents the potential status of the image sensing device 10 shown in FIG. 2 by a solid line, and a solid line represents a potential status of the image sensing device 150.

As in the image sensing device 150, when the N+ region 152 is enlarged at a surface side of the silicon substrate, a depth at a potential peak start may be shallower as shown in FIG. 8, thereby increasing the saturated signal electric charge quantity (Qs).

However, similar to the image sensing device 100 shown in FIG. 5, a surface electric field is increased, thereby degrading a white spot.

An image sensing device according to at least one example embodiment has a structure such that the saturated signal electric charge quantity (Qs) may be increased, the white spot is not degraded, and the readout failure is not generated.

<Configuration of Image Sensing Device>

Figure 9:
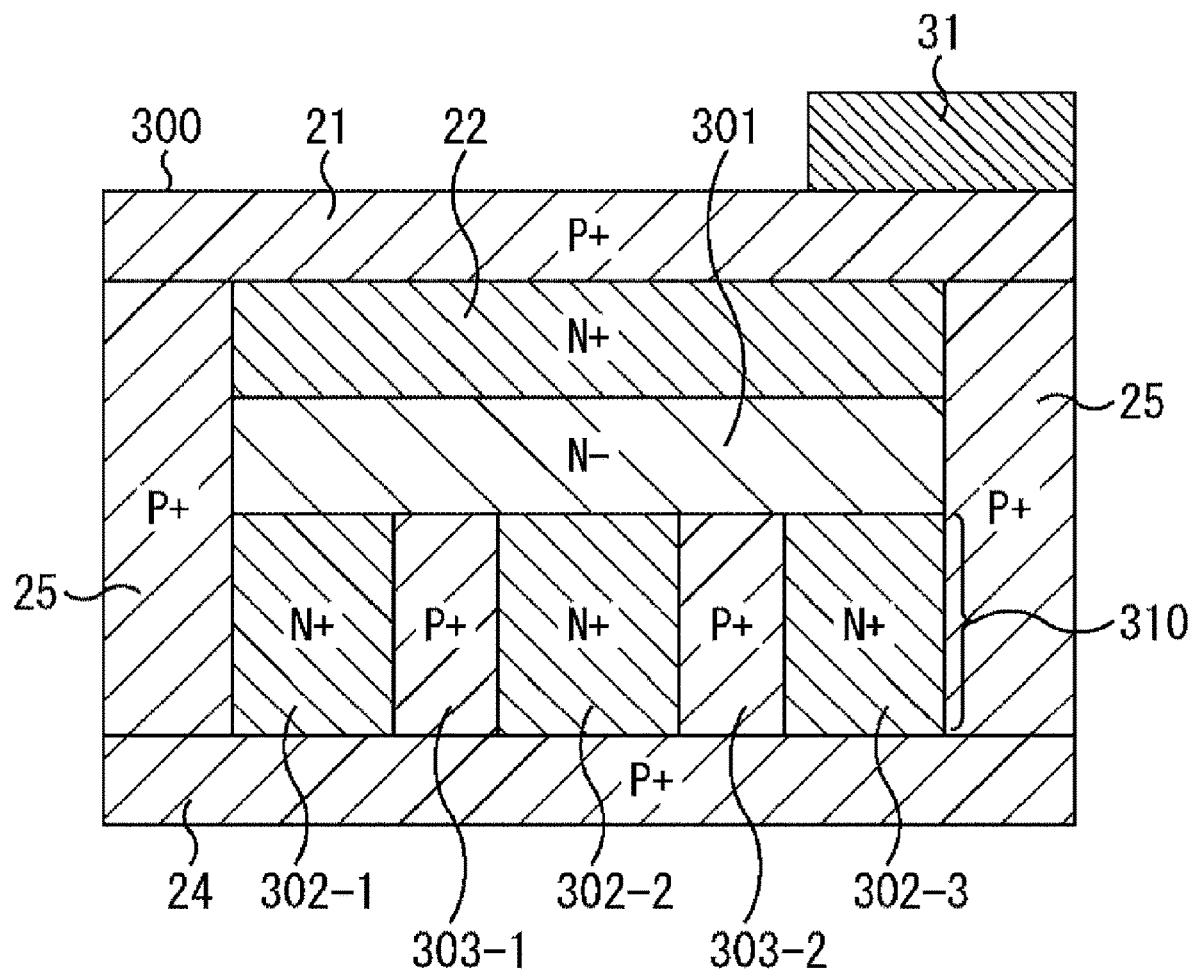
FIG. 9 is a view showing a configuration of an embodiment of an image sensing device to which the present technology is applied.

FIG. 9 is a view showing a configuration of an embodiment of an image sensing device to which the present technology is applied.

In an image sensing device or pixel 300 shown in FIG. 9, parts having a similar configuration of the image sensing device 10 shown in FIG. 1 are denoted by the same reference numerals, and thus detailed description thereof will be hereinafter omitted. The image sensing device 300 shown in FIG. 9 is different from the image sensing device 10 shown in FIG. 1 in that the N− region 23 is configured of an N− region 301, N+ regions 302-1, 302-2, and 302-3 (collectively referred to as 302), and P+ regions 303-1 and 303-2 (collectively referred to as 303), but is similar otherwise.

In the image sensing device 300, the N− region 301 having a low concentration disposed as a lower layer of the N+ region 22 having a high concentration is shallow, a layer including N+ regions 302 and P+ regions 303 is formed between the N− region 301 and the P+ region 24 having a high concentration. Here, the layer including the N+ regions 302 and the P+ regions is described as a PN junction capacity expansion part 310. The PN junction capacity expansion part 310 is disposed to enlarge a signal electric charge accumulation part of the image sensing device 300, and therefore is described here as the capacity expansion part.

The PN junction capacity expansion part 310 includes an N+ region 302-1, an N+ region 302-2, an N+ region 302-3, a P+ region 303-1, and a P+ region 303-2, a P+ region 303-1 is formed between the N+ region 302-1 and the N+ region 302-2, a P+ region 303-2 is formed between the N+ region 302-2 and the N+ region 302-3, in the example shown in FIG. 9.

In this way, the PN junction capacity expansion part 310 has a structure that the N+ regions 302 (N type impurity regions) and the P+ regions 303 (P type impurity regions) are arranged alternately.

A pitch distance of the PN junction capacity expansion part 310, i.e., a repeat distance of the N+ region 302 and the P+ region 303, may be, for example, preferably 1.0 μm or less. A combined width of the N+ region 302-1 and the P+ region 303-1 is 1.0 μm or less, for example. When the pitch distance is decreased to minute, a concentration of N type impurities injected therein increases, thereby further increasing the saturated signal electric charge quantity (Qs).

As described later, the pitch distance of the PN junction capacity expansion part 310 may be uniform as in the image sensing device 300 shown in FIG. 9, but may be nonuniform in other embodiments. Here, in one embodiment, the repeat distance of the N+ region 302 and the P+ region 303 is 1.0 μm or less, for example. However, it is not the description that limits an application scope range of the present technology. The present technology may be applicable to other distances. For example, even when the distance is 1.0 μm or more, the present technology is applicable.

When the N+ region 22 and the N− region 301 are considered to be layers disposed in a vertical direction, the N+ regions 302 and the P+ regions 303 of the PN junction capacity expansion part 310 are disposed in a vertical direction. The PN junction capacity expansion part 310 has a configuration that the N+ regions 302 and the P+ regions 303 are laminated (or arranged) alternately in a vertical direction, and are laminated in a direction different from other layers. It should be understood that the impurity regions (e.g., regions 22, 301, 302, 303, etc.) illustrated FIG. 9 are not limited to the relative impurity concentrations and configurations shown, but to illustrate example materials of the image sensing device 300. Thus, throughout the instant description, N+ and/or N− regions 22, 301 and/or 302 may be referred to as a first material or N type regions while P+ and/or P− regions 21, 25, and/or 303 may be referred to as a second material or P type regions. Furthermore, it should be understood that example embodiments are not limited to the first material being N type and the second material being P type. For example, the first material may be a conductive material while the second material may be an insulative material with a conductivity that is less than the first material.

Figure 10:
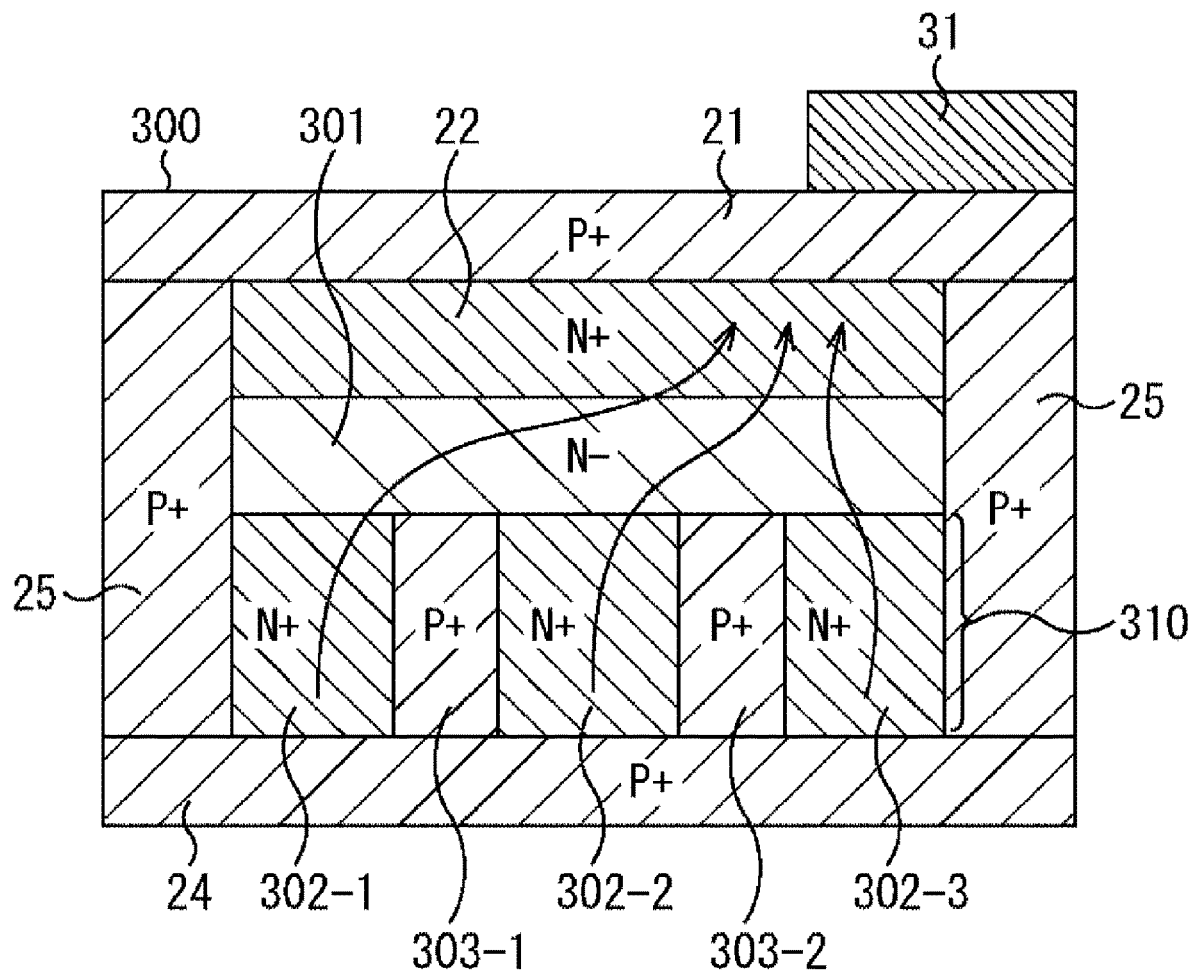
FIG. 10 is a view for explaining a flow of an electric charge.

Also, the PN junction capacity expansion part 310 has a potential gradient, as shown in FIG. 10. FIG. 10 is a view showing the image sensing device or pixel 300 similar to FIG. 9, and shows a flow of an electric charge by arrows in the image sensing device 300.

As shown by the arrows, the potential gradient is provided so that an electric charge generated at the N+ region 302-1, an electric charge generated at the N+ region 302-2, and an electric charge generated at the N+ region 302-3 are moved to near the readout electrode 31. In other words, the potential gradient is provided between the PN junction capacity expansion part 310 and the readout electrode 31 for reading out the electric charges.

Figure 11:
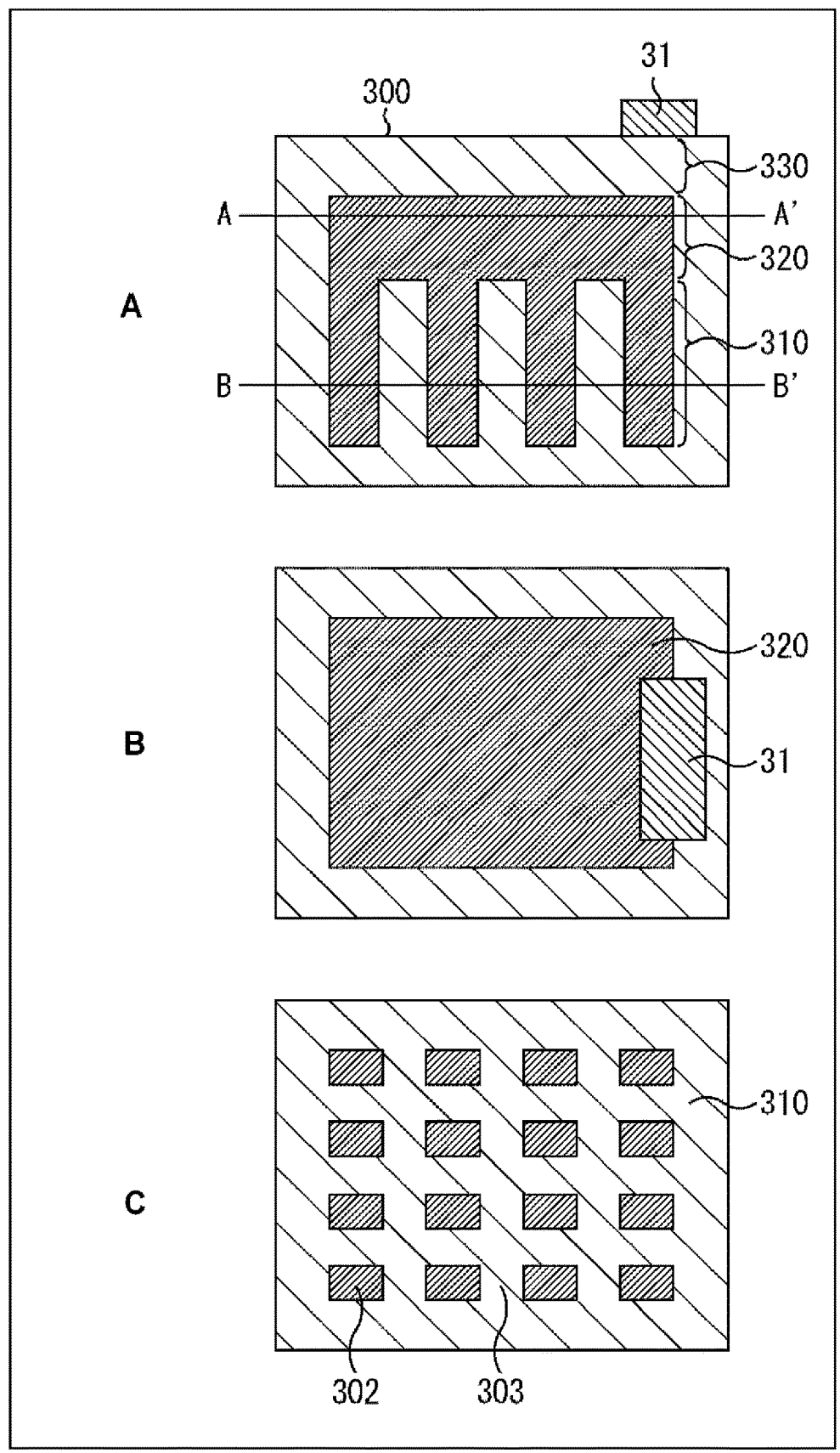
FIG. 11 is a cross-sectional view of an image sensing device.

FIGS. 11A-11C are top views of the image sensing device (or pixel in an imaging device) 300 shown in FIG. 9. FIG. 11A is a cross-sectional view of the image sensing device 300 similar to the image sensing device 300 shown in FIG. 9. In the image sensing device 300 shown in FIG. 11A, the PN junction capacity expansion part 310 is similar to the PN junction capacity expansion part 310 of the image sensing device 300 shown in FIG. 9, an N type impurity region 320 includes the N+ region 22 and the N− region 301, and a P type impurity region 330 is the P+ region 21.

As shown FIG. 11A, in the image sensing device 300, the P type impurity region 330, the N type impurity region 320, and the PN junction capacity expansion part 310 are laminated from the side where the readout electrode 31 is provided.

The P type impurity region 330 and the N type impurity region 320 are layers laminated in a horizontal direction. The PN junction capacity expansion part 310 is in a direction different from the layer of the P type impurity region 330 and the layer of the N type impurity region 320, and the N+ region 302 and the P+ region 303 are layers laminated in a vertical direction in FIG. 11A.

In this manner, the PN junction capacity expansion part 310 may be a layer laminated in a direction different from other layers. The different direction may be a direction crossing perpendicularly with other layers, or may be a direction (oblique direction) crossing at a predetermined (or alternatively, desired) angle.

FIG. 11B is a cross-sectional view of the image sensing device 300 shown in FIG. 11A cutting along A-A'. FIG. 11C is a cross-sectional view of the image sensing device 300 shown in FIG. 11A cutting along B-B'. That is to say, FIG. 11B is a cross-sectional view of the N type impurity region 320, and FIG. 11C is a cross-sectional view of the PN junction capacity expansion part 310.

As shown in FIG. 11B, in the cross-sectional view of the N type impurity region 320, N type impurities are uniformly diffused. In FIG. 11B, the readout electrode 31 is also shown for reference. The readout electrode 31 is disposed to cover a part of the N type impurity region 320. It should be understood that FIGS. 11B and 11C are lateral cross sections of FIG. 11A. For example, FIG. 11C is a first lateral cross section of FIG. 11A and FIG. 11B is a second lateral cross section of FIG. 11A. However, the terms first and second are used for the sake of convenience and do not limit example embodiments. It should be further understood that the image sensing device 300 may correspond to a pixel in an array of pixels disposed in a substrate of an imaging device (not labeled). As shown in FIG. 9 and FIG. 11A, the pixel includes a first material (e.g., N type impurity regions 22, 301, 302, and 320) disposed in the substrate, and a second material (e.g., P type impurity regions 302 and 330) disposed in the substrate. Further, as shown in FIG. 11A, a first region of the first material (e.g., leftmost branch of N type impurity region in PN junction capacity expansion part 310), a second region of the first material (e.g., branch of N-type impurity region in PN junction capacity expansion part 310 immediately adjacent to the leftmost branch), and a third region of the second material (e.g., form at least one junction (e.g., a PN junction). Further, as shown in FIG. 11C, the first lateral cross section of the substrate intersects the at least one junction (i.e., intersects the regions 302 and 303). A second lateral cross section (e.g., FIG. 11B) of the substrate intersects at least one fourth region of the first material (e.g., N type impurity region 320). As shown in FIGS. 11B and 11C, the at least one fourth region of the first material (e.g., N-type impurity region 320 in FIG. 11B) occupies a different amount (e.g., greater amount) of surface area in the second lateral cross section in FIG. 11B than the first region of the first material and the second region of the first material occupy in the first lateral cross section in FIG. 11C. That is, the N-type impurity region 320 in FIG. 11B occupies a different amount (e.g., a greater amount) of surface area than the N-type impurity region in FIG. 11C (illustrated as N+ regions 302). It should be further understood that the first lateral cross section (e.g., FIG. 11C) is taken closer to a light incident side of the image sensing device 300 (or first pixel) than the second lateral cross section (e.g., FIG. 11B). As illustrated in FIGS. 11A-11C, the first material is an N type material and the second material is a P type material. However, example embodiments are not limited thereto. According to at least one other embodiment, the first material is a conductive material (e.g., N type material) and the second material is an insulating material (see, for example, FIG. 34). It should be appreciated from FIGS. 11A-11C that the first material (e.g., N type material) looks like a single region from the perspective of the readout electrode 31 (see FIG. 11B), and looks like multiple regions or multiple junctions from the perspective of a light incident side of the image sensing device 300 (see FIG. 11C). This increases the saturated signal electric charge quantity while allowing for the readout electrode 31 to disposed at various positions (see FIG. 12).

Figure 12:
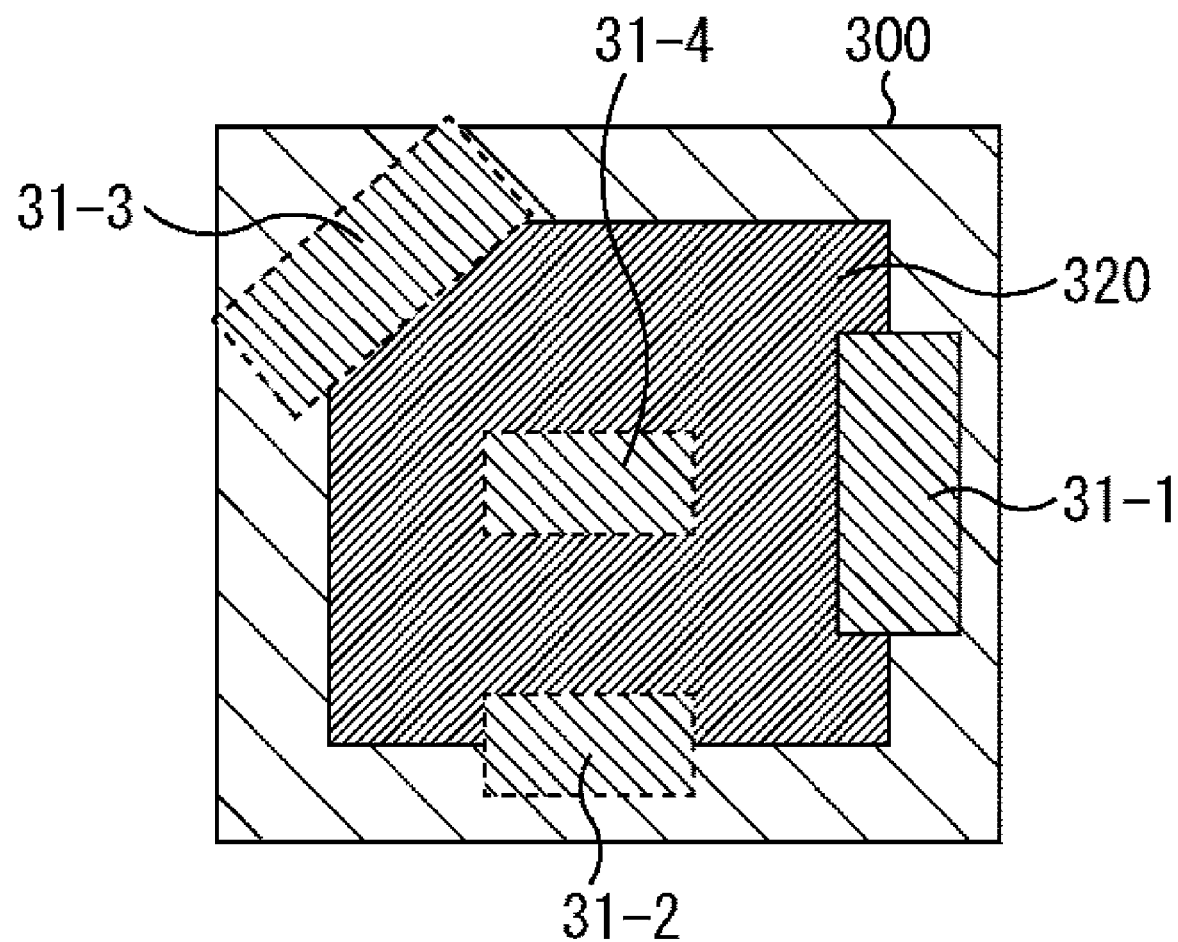
FIG. 12 is a view for explaining an arrangement of a readout electrode.

In the image sensing device 300 to which the present technology is applied, a position of the readout electrode 31 is not limited, and may be disposed at various positions shown in FIG. 12. Referring to FIG. 12, a readout electrode 31-1 may be provided at the N type impurity region 320 in a right side in FIG. 12 similar to FIG. 11B. Alternatively, a readout electrode 31-2 may be provided at the N type impurity region 320 in a lower side in FIG. 12 as shown in FIG. 12.

The readout electrode, i.e., the readout electrode 31-1 or the readout electrode 31-2 as shown, has high degree of freedom not only in the position, but also in the size. The present technology may be applied to the readout electrode having any size. In addition, as shown in FIG. 12, a readout electrode 31-3 may be provided at a corner of the N type impurity region 320. Furthermore, as shown in FIG. 12, a readout electrode 31-4 may be provided at a center of the N type impurity region 320.

The readout electrode 31 is disposed at any position of the readout electrodes 31-1 to 31-4. Note that the readout electrode 31 may be disposed at a position other than the positions shown in FIG. 12.

According to the present technology, the structure for increasing the saturated signal electric charge quantity (Qs) is disposed not at near the surface of the substrate as in the image sensing device described referring to FIG. 3 to FIG. 8, but at the back side of the substrate. The readout electrode 31 disposed at the surface of the substrate can be at a desirable position without limitation, as described above. That is to say, as the PN junction capacity expansion part 310 does not affect thereon, the readout electrode 31 has no limitation.

FIG. 11C is a cross-sectional view of the PN junction capacity expansion part 310. In the cross-section of the PN junction capacity expansion part 310, the N+ regions 302 and the P+ regions 303 are disposed alternately. The N+ regions 302 of the PN junction capacity expansion part 310 are disposed in a lattice and are dispersed as 16 squares in the embodiment shown in FIG. 11C.

One square may have any size, and desirably, for example, 1.0 μm or less (a combined size of the N type region and the P type region adjacent in the square is 1.0 μm or less) as described above. Although the shape is square here, a four-sided square, a rectangle, a rhombus, a trapezoidal, or any shape such as a circle and an oval other than the square may be possible.

<Shape of N+ Region in PN Junction Capacity Expansion Part>

Here, referring to FIG. 13 to FIG. 26, the shape of the N+ region 302 in the PN junction capacity expansion part 310 will be further described. FIG. 13 to FIG. 26 each shows a cross-sectional view of the PN junction capacity expansion part 310 similar to FIG. 11C. Also, FIG. 13 to FIG. 26 each shows the readout electrode 31 for explanation.

The shape of the N+ region 302 in the PN junction capacity expansion part 310 is described as an example. If the shape of the P+ region 303 in the PN junction capacity expansion part 310 is described as an example, it is basically similar. Here, the N+ region 302 is described as an example.

Figure 13:
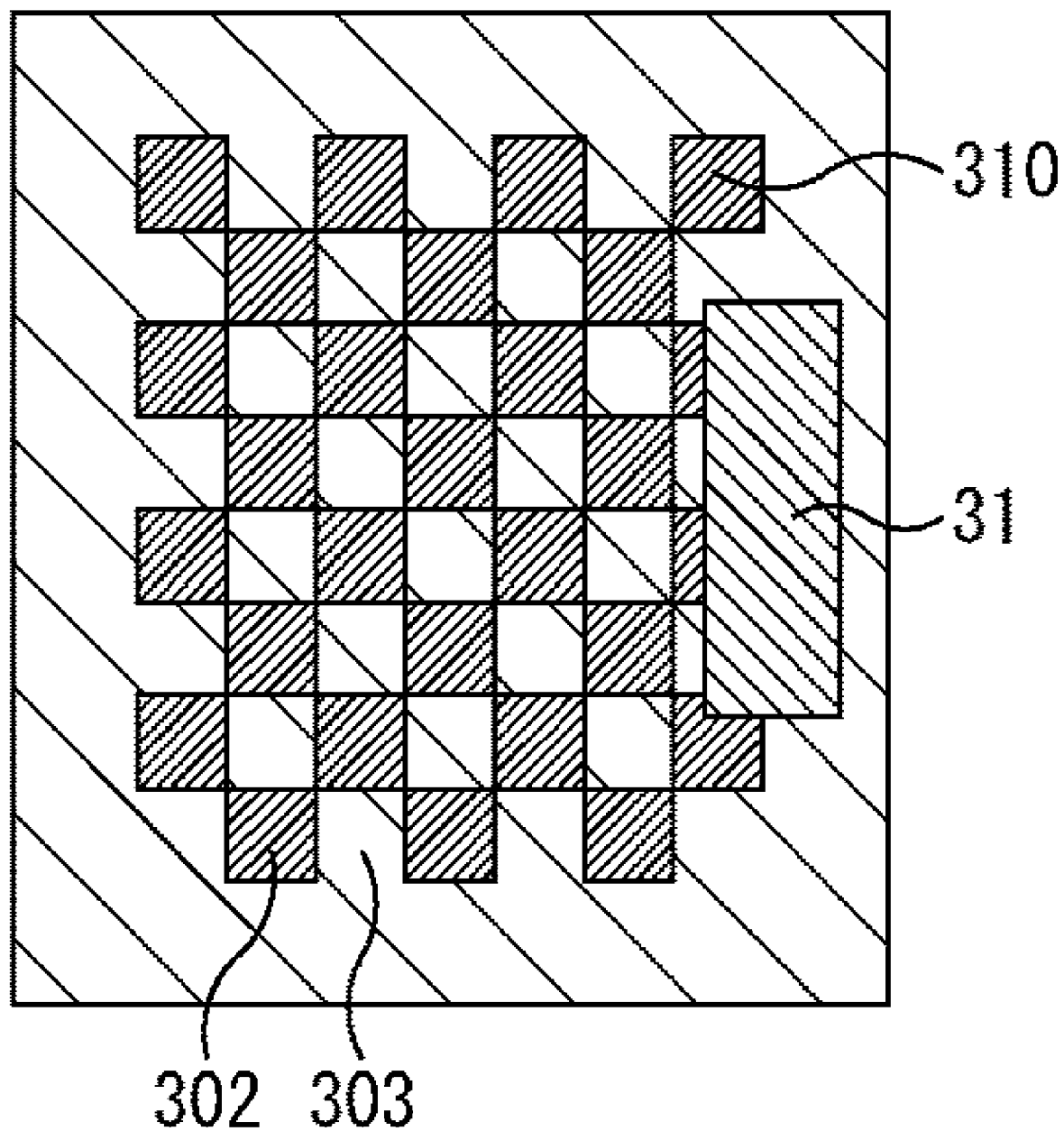
FIG. 13 is a view showing an example of a shape of an N+ region in a PN junction capacity expansion part.

The N+ regions 302 of the PN junction capacity expansion part 310 shown in FIG. 13 are disposed in a lattice same as the N+ regions 302 shown in FIG. 11C, but are dispersed as 28 squares where one square is small. In addition, the respective N+ regions 302 are formed so that corners are in contact therewith. In this manner, the shapes of the N+ regions 302 in the PN junction capacity expansion part 310 may be in the lattice, and one lattice may be formed small. As shown in FIG. 13, the first material (e.g., N+ regions 302) and the second material (e.g., regions 303) are in a checkered pattern. For example, wherein the first material (e.g., regions 302) forms a grid of n columns and m rows in the second material.

Figure 14:
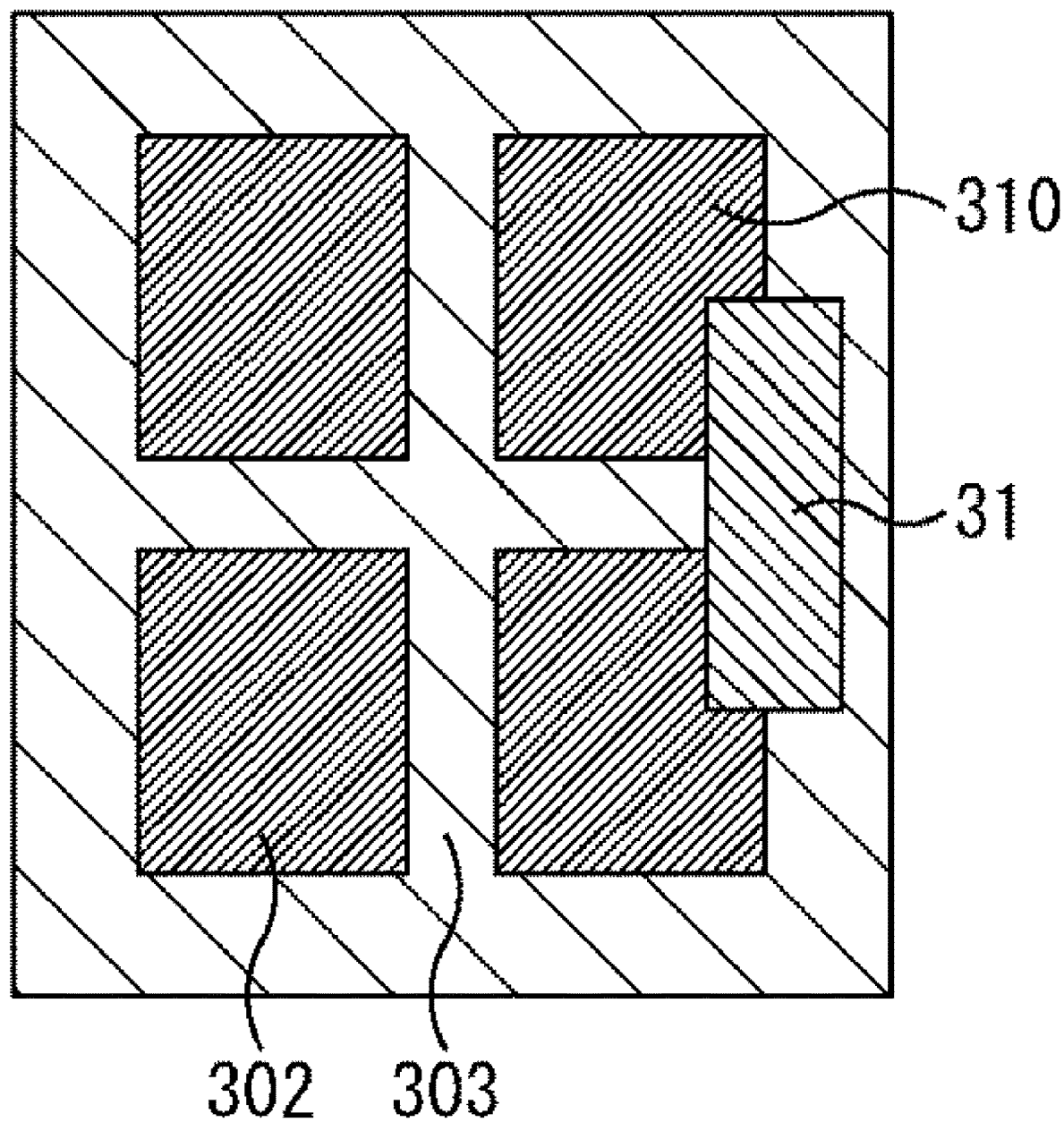
FIG. 14 is a view showing an example of a shape of an N+ region in a PN junction capacity expansion part.

The N+ regions 302 of the PN junction capacity expansion part 310 shown in FIG. 14 are disposed in a lattice same as the N+ regions 302 shown in FIG. 11C, but are dispersed as 4 squares where one square is large. In this manner, the shapes of the N+ regions 302 in the PN junction capacity expansion part 310 may be in the lattice, and one lattice may be formed large.

As described above, when the N+ regions 302 of the PN junction capacity expansion part 310 shown in FIG. 14 are applied under the condition that the pitch distance of the PN junction capacity expansion part 310 is preferably 1.0 µm or less, the N+ regions 302 can be provided in a state that the condition is satisfied as long as one pixel is small. That is to say, the size of the N+ regions 302 in the PN junction capacity expansion part 310 may be set depending on the size of one pixel.

Figure 15:
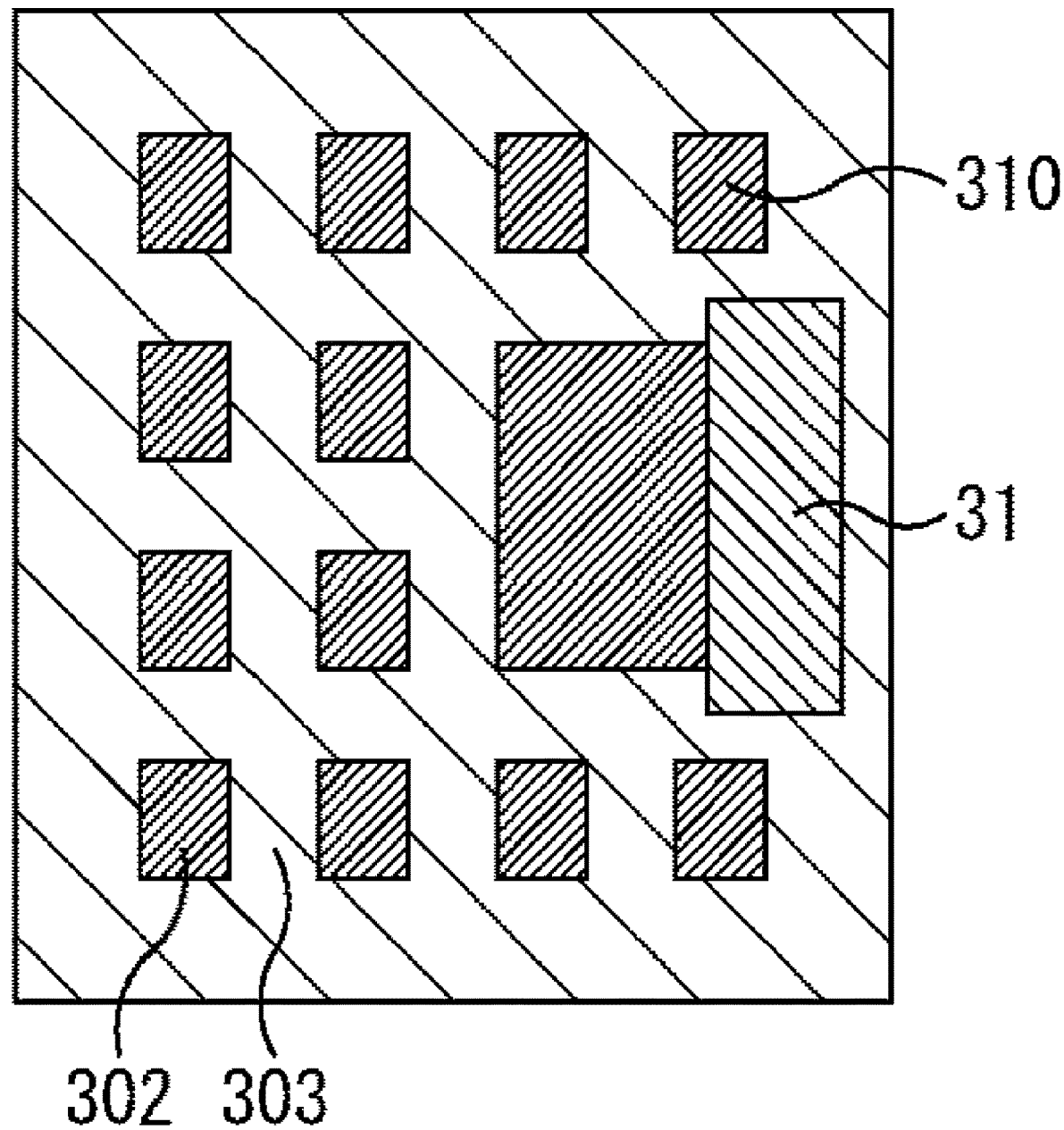
FIG. 15 is a view showing an example of a shape of an N+ region in a PN junction capacity expansion part.

The N+ regions 302 of the PN junction capacity expansion part 310 shown in FIG. 15 are disposed in a lattice same as the N+ regions 302 shown in FIG. 11C, but the N+ region 302 disposed at the readout electrode 31 is greater than the N+ regions 302 at other regions. In this manner, the shapes and the sizes of the respective N+ regions 302 in the PN junction capacity expansion part 310 may be not the same.

Figure 16:
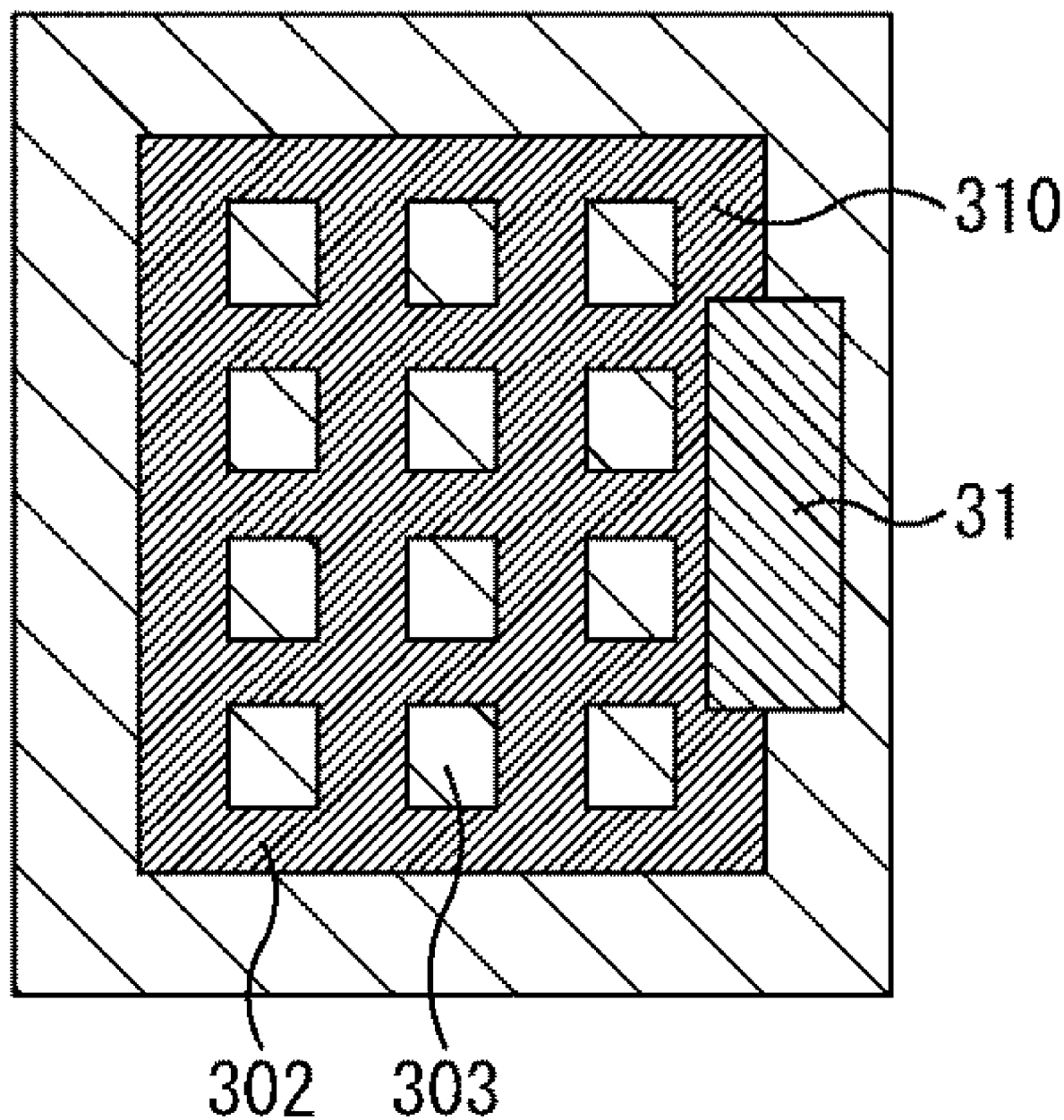
FIG. 16 is a view showing an example of a shape of an N+ region in a PN junction capacity expansion part.

The P+ regions 303 of the PN junction capacity expansion part 310 shown in FIG. 16 are formed discretely in a lattice and the N+ regions 302 fill the space between the P+ regions 303. The N+ regions 302 are connected excluding the P+ regions 303. That is, the second material (e.g., regions 303) forms a grid of n columns and m rows in the first material (e.g., regions 302). As shown in FIG. 16, the N+ regions 302 are not be formed as those shown in FIG. 15, i.e., the N+ regions 302 are formed apart with no connections.

Figure 17:
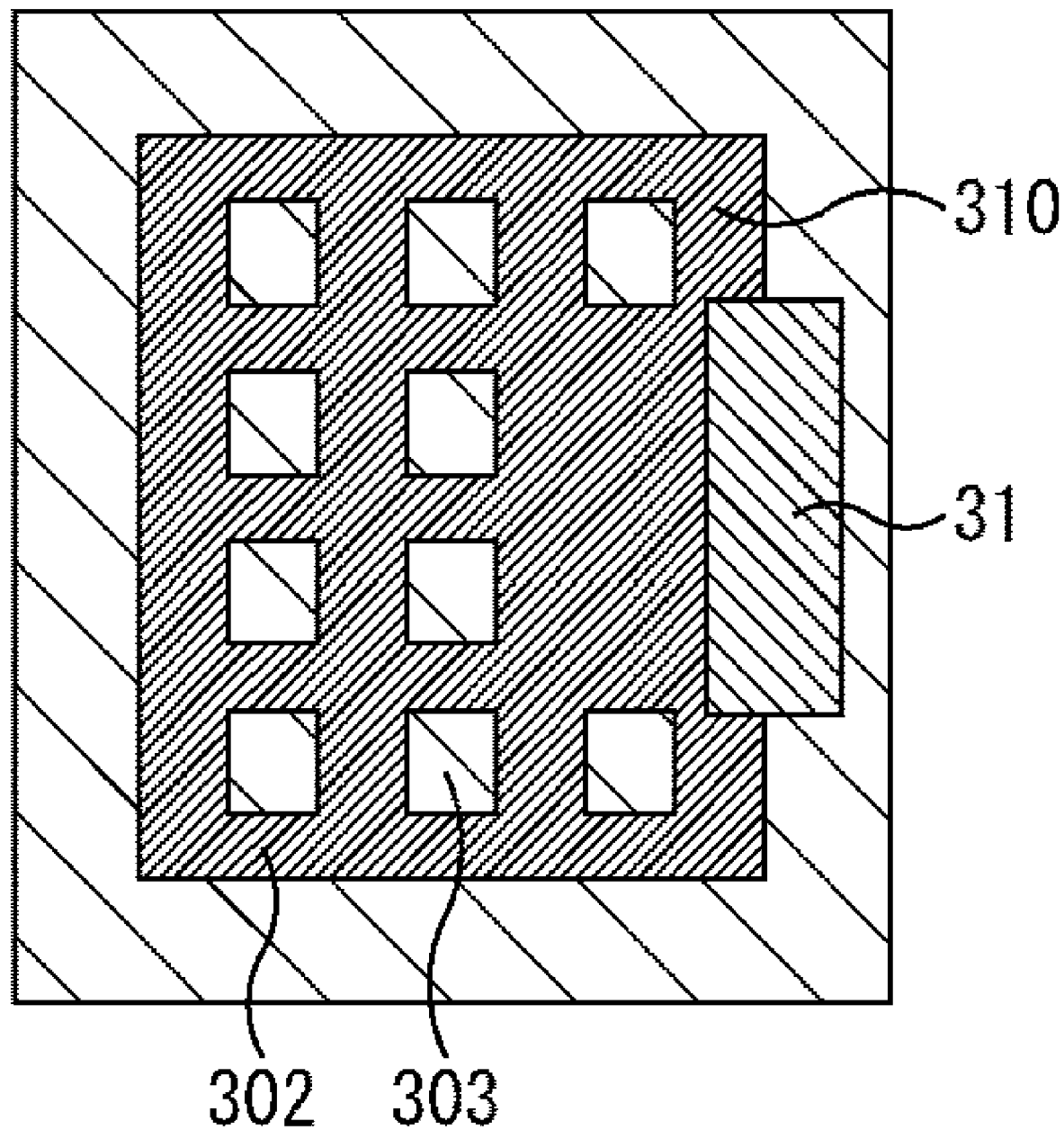
FIG. 17 is a view showing an example of a shape of an N+ region in a PN junction capacity expansion part.

The N+ regions 302 of the PN junction capacity expansion part 310 shown in FIG. 17 are similar to the N+ regions 302 shown in FIG. 16, but the N+ region 302 disposed at the readout electrode 31 is greater than the N+ regions 302 at other regions, and no P+ regions 303 are provided at the readout electrode 31.

Figure 18:
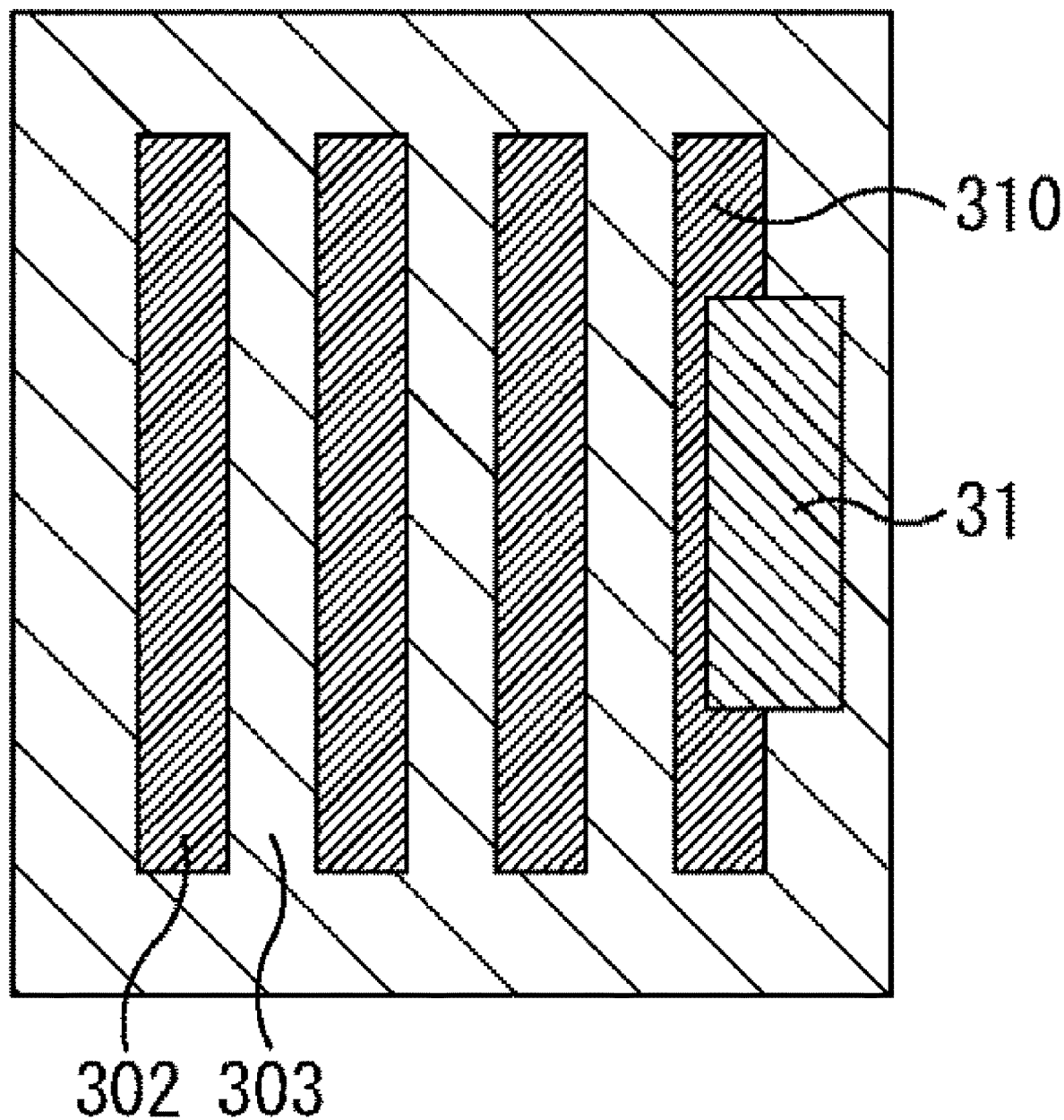
FIG. 18 is a view showing an example of a shape of an N+ region in a PN junction capacity expansion part.

The N+ regions 302 of the PN junction capacity expansion part 310 shown in FIG. 18 are formed rectangular such that long sides of the rectangle are in parallel with the readout electrode 31.

Figure 19:
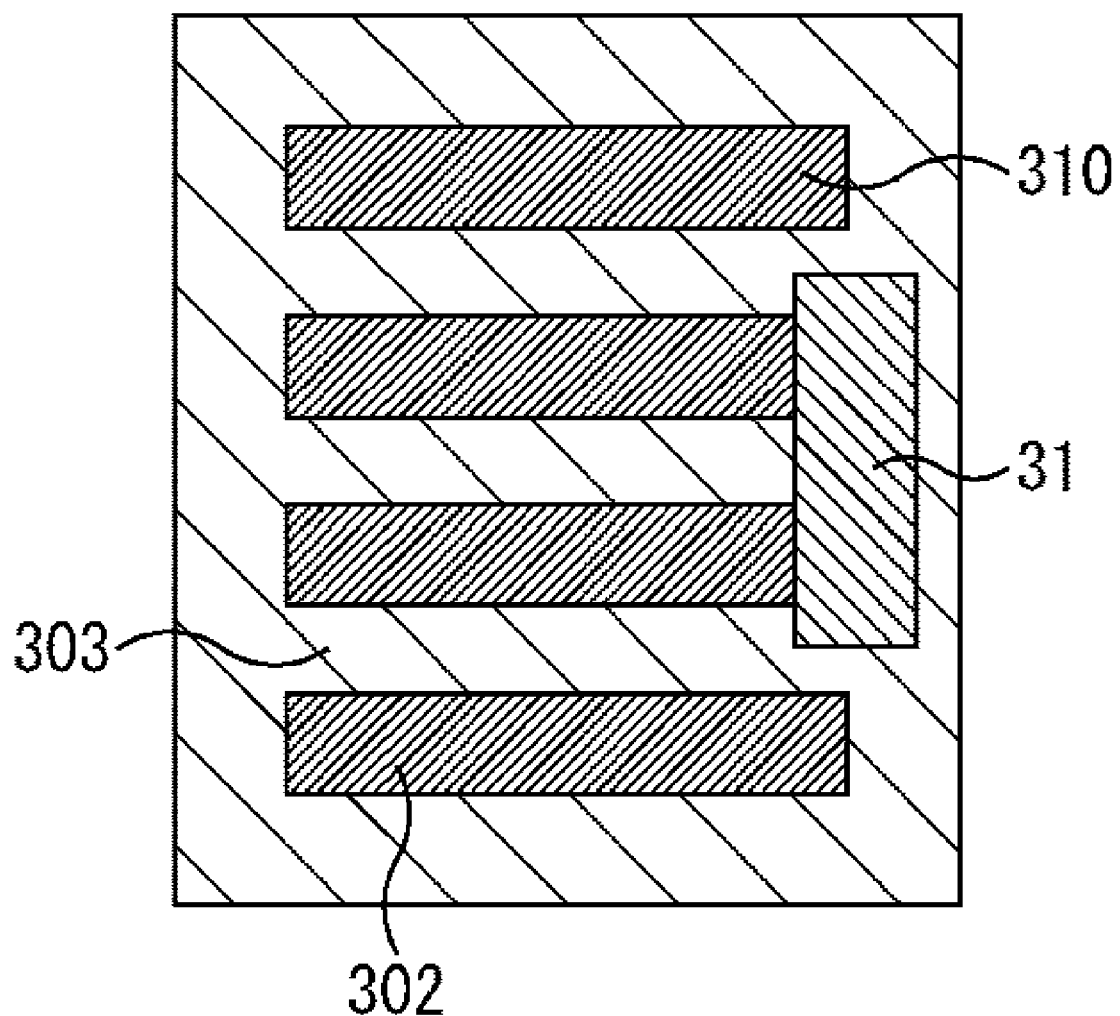
FIG. 19 is a view showing an example of a shape of an N+ region in a PN junction capacity expansion part.

The N+ regions 302 of the PN junction capacity expansion part 310 shown in FIG. 19 are formed rectangular similar to the N+ regions 302 shown in FIG. 18, but are different from those in respect to the directions. The N+ regions 302 shown in FIG. 19 are formed rectangular such that long sides of the rectangle are orthogonal to the readout electrode 31.

Figure 20:
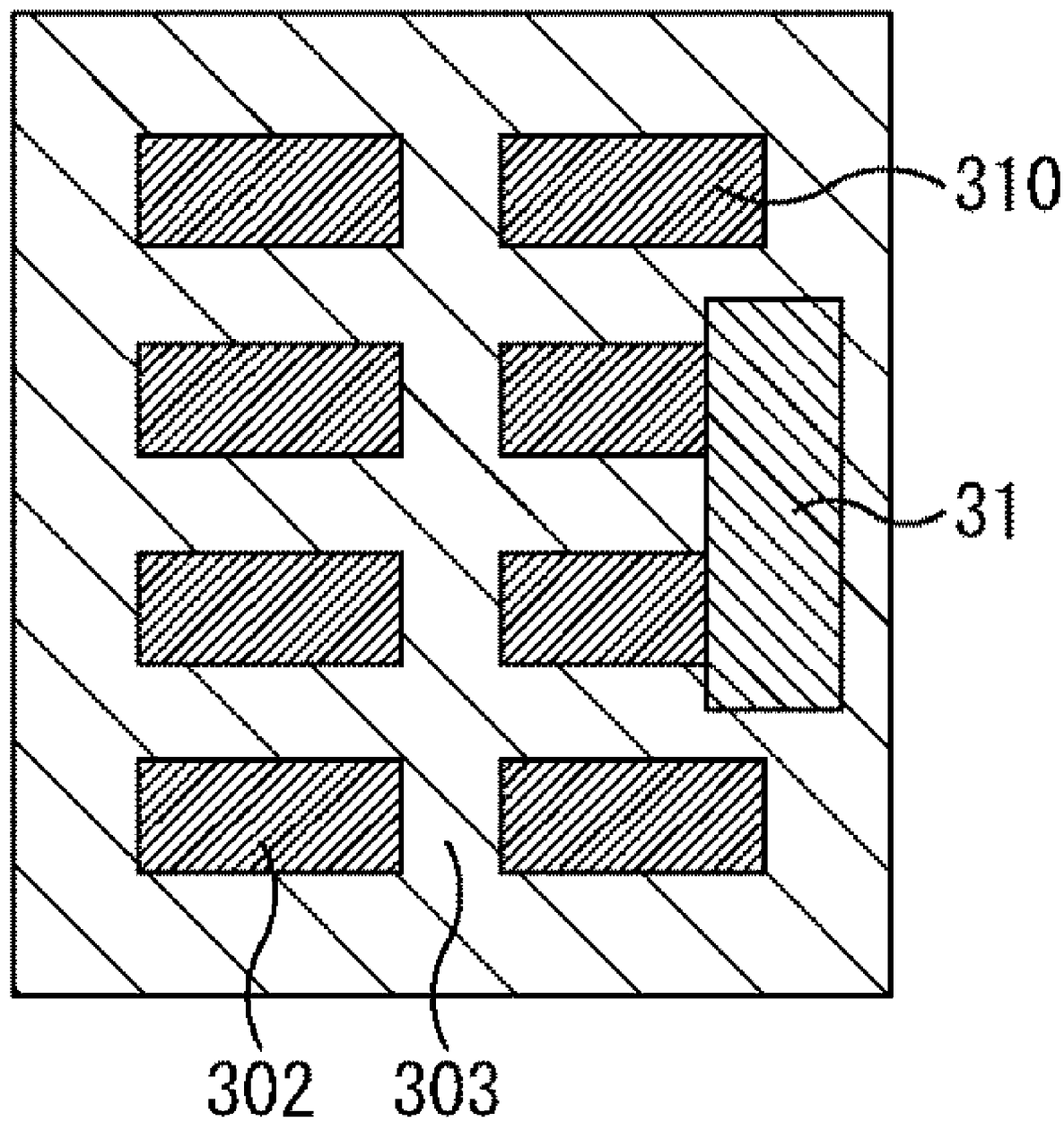
FIG. 20 is a view showing an example of a shape of an N+ region in a PN junction capacity expansion part.

The N+ regions 302 of the PN junction capacity expansion part 310 shown in FIG. 20 are formed rectangular similar to the N+ regions 302 shown in FIG. 19, but are different from those in respect to the sizes. The N+ regions 302 shown in FIG. 20 are formed rectangular such that long sides of the rectangle are orthogonal to the readout electrode 31. Between the N+ regions 302, the P+ regions 303 are provided.

As shown in FIG. 18 to FIG. 20, the shape of the N+ regions 302 may be rectangular, and the long sides of the rectangle may be in parallel with or orthogonal to the readout electrode 31. That is, the first material (e.g., N+ regions 302) and the second material (e.g., P+ regions 303) have linear shapes in the first lateral cross section.

Figure 21:
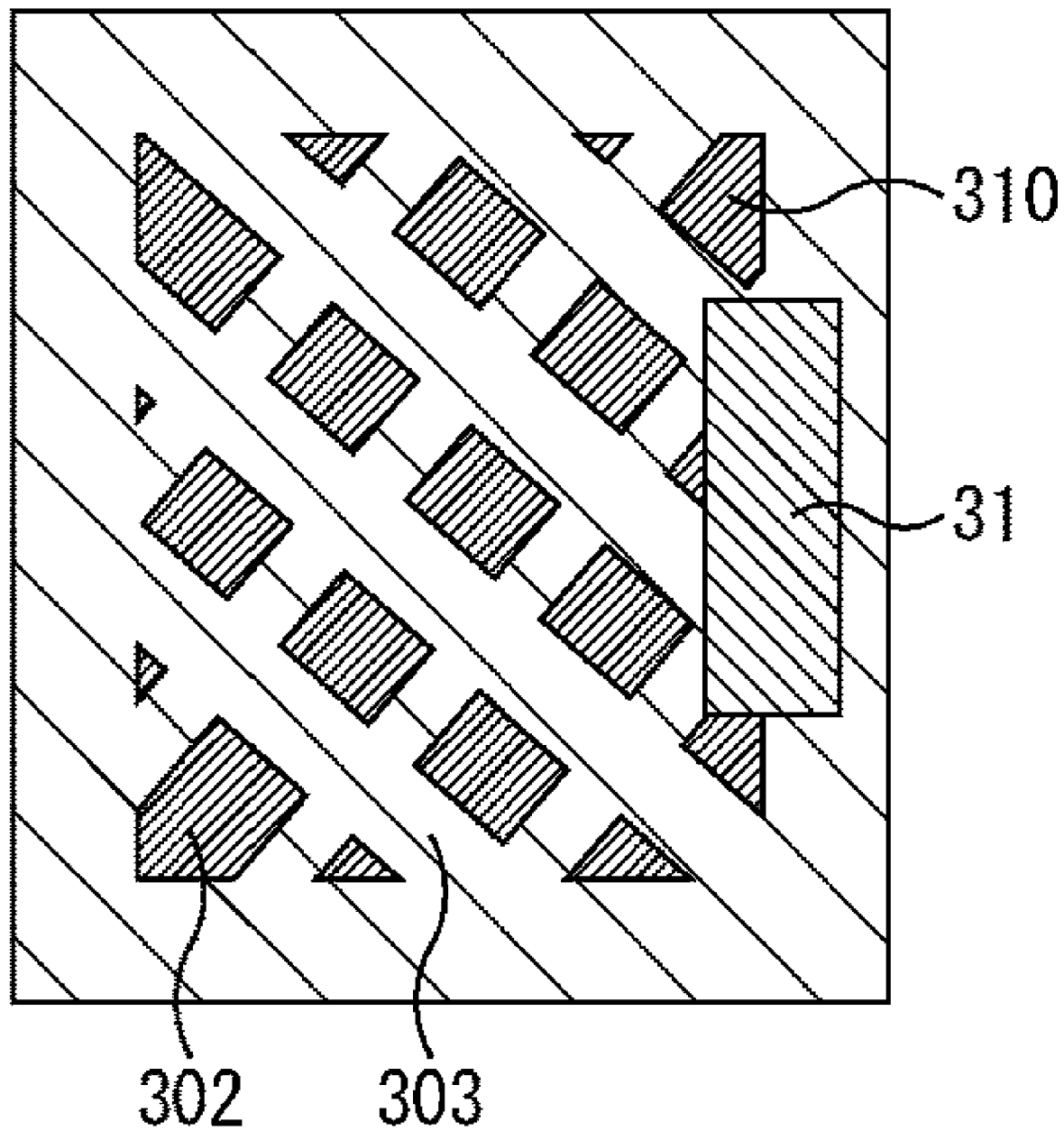
FIG. 21 is a view showing an example of a shape of an N+ region in a PN junction capacity expansion part.

The N+ regions 302 of the PN junction capacity expansion part 310 shown in FIG. 21 fill the regions excluding the P+ regions 303 each provided in a straight line to an oblique direction with a predetermined (or alternatively, desired) width within the PN junction capacity expansion part 310.

Figure 22:
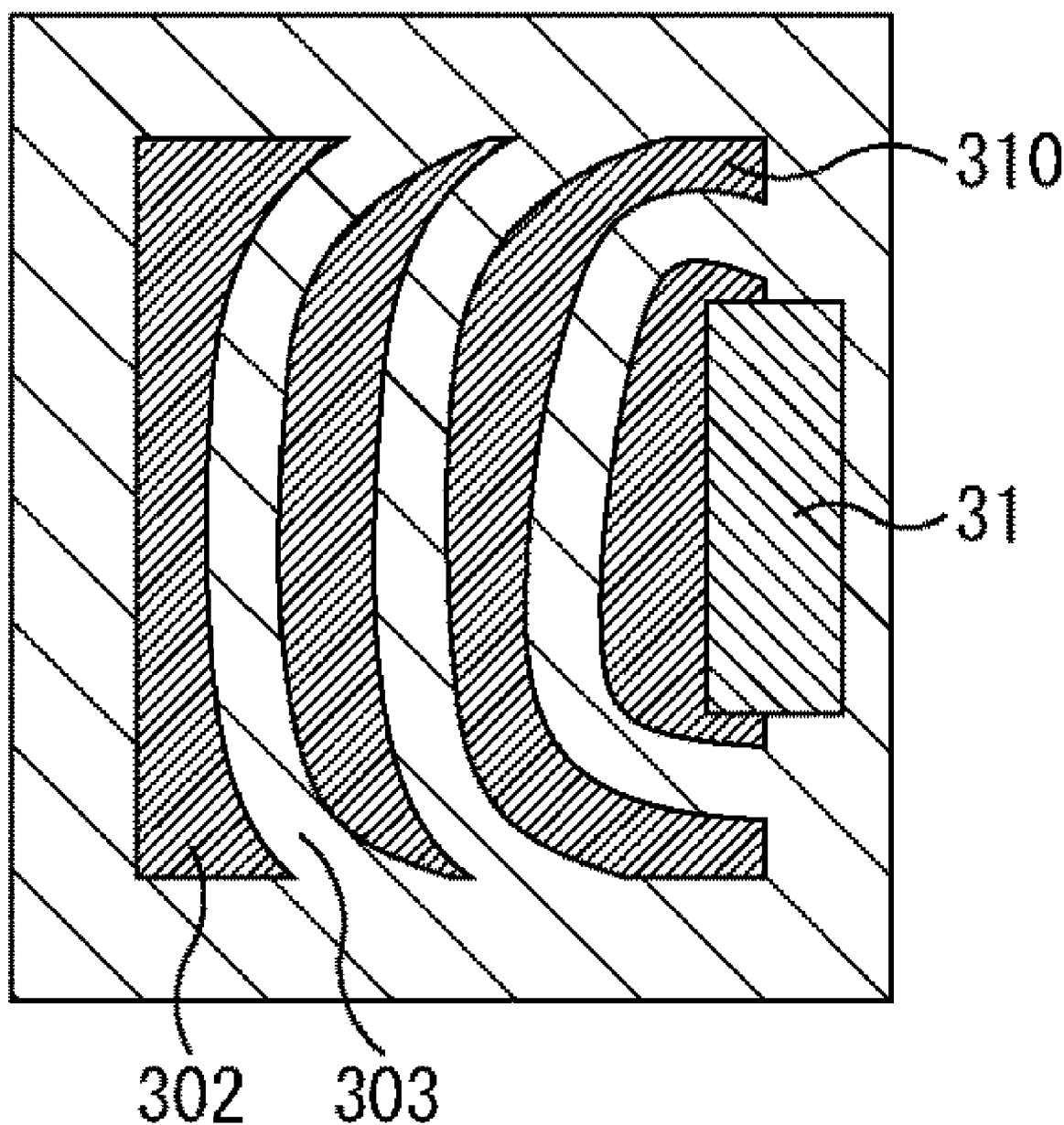
FIG. 22 is a view showing an example of a shape of an N+ region in a PN junction capacity expansion part.

The N+ regions 302 of the PN junction capacity expansion part 310 shown in FIG. 22 fill the regions excluding the P+ regions 303 each provided in a curved shape (partly in a straight line) with a predetermined (or alternatively, desired) width within the PN junction capacity expansion part 310.

Figure 23:
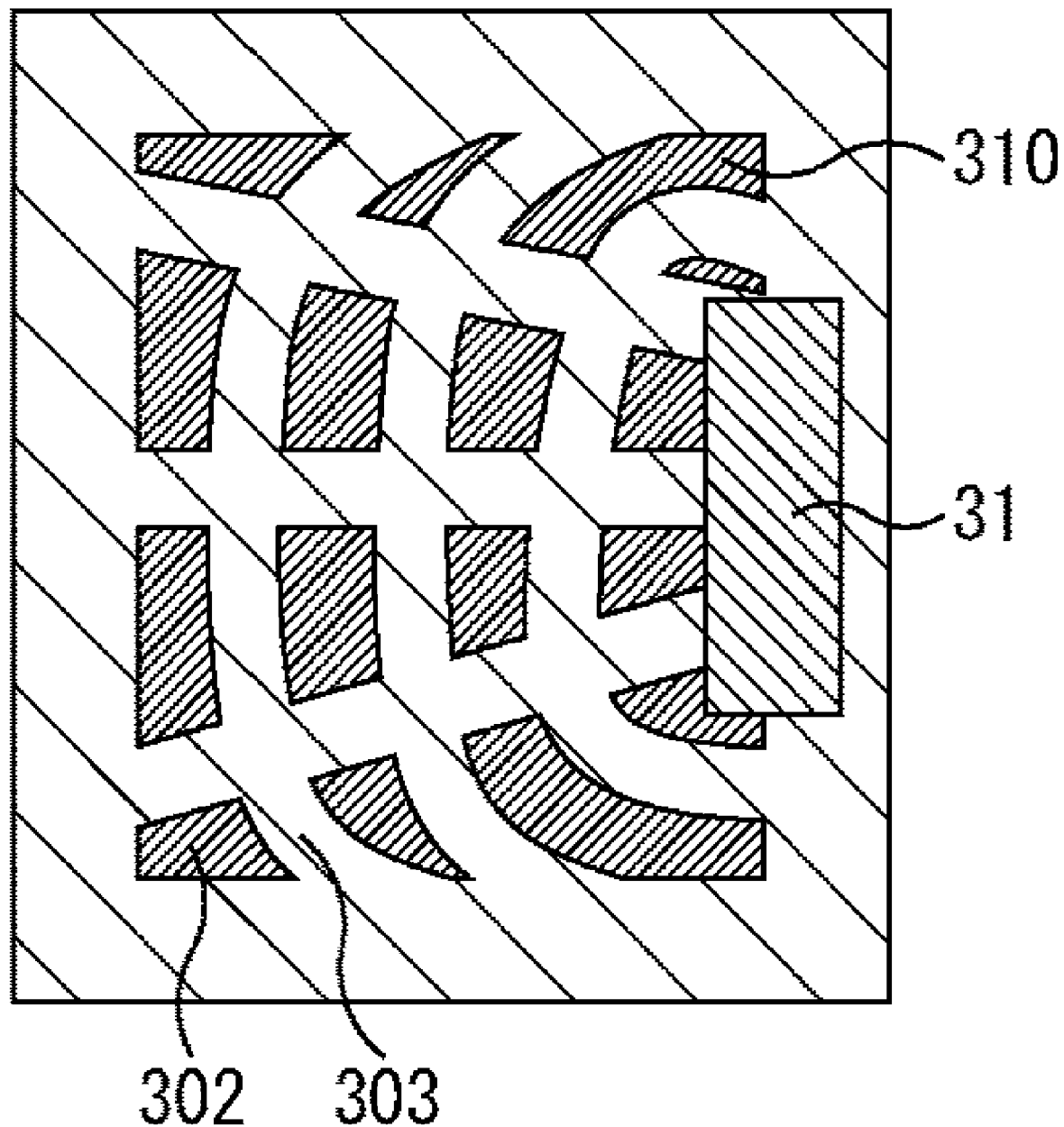
FIG. 23 is a view showing an example of a shape of an N+ region in a PN junction capacity expansion part.

The N+ regions 302 of the PN junction capacity expansion part 310 shown in FIG. 23 are provided further excluding the P+ regions 303 each provided in a straight line to oblique and horizontal directions with a predetermined (or alternatively, desired) width from the N+ regions 302 shown in FIG. 22.

Figure 24:
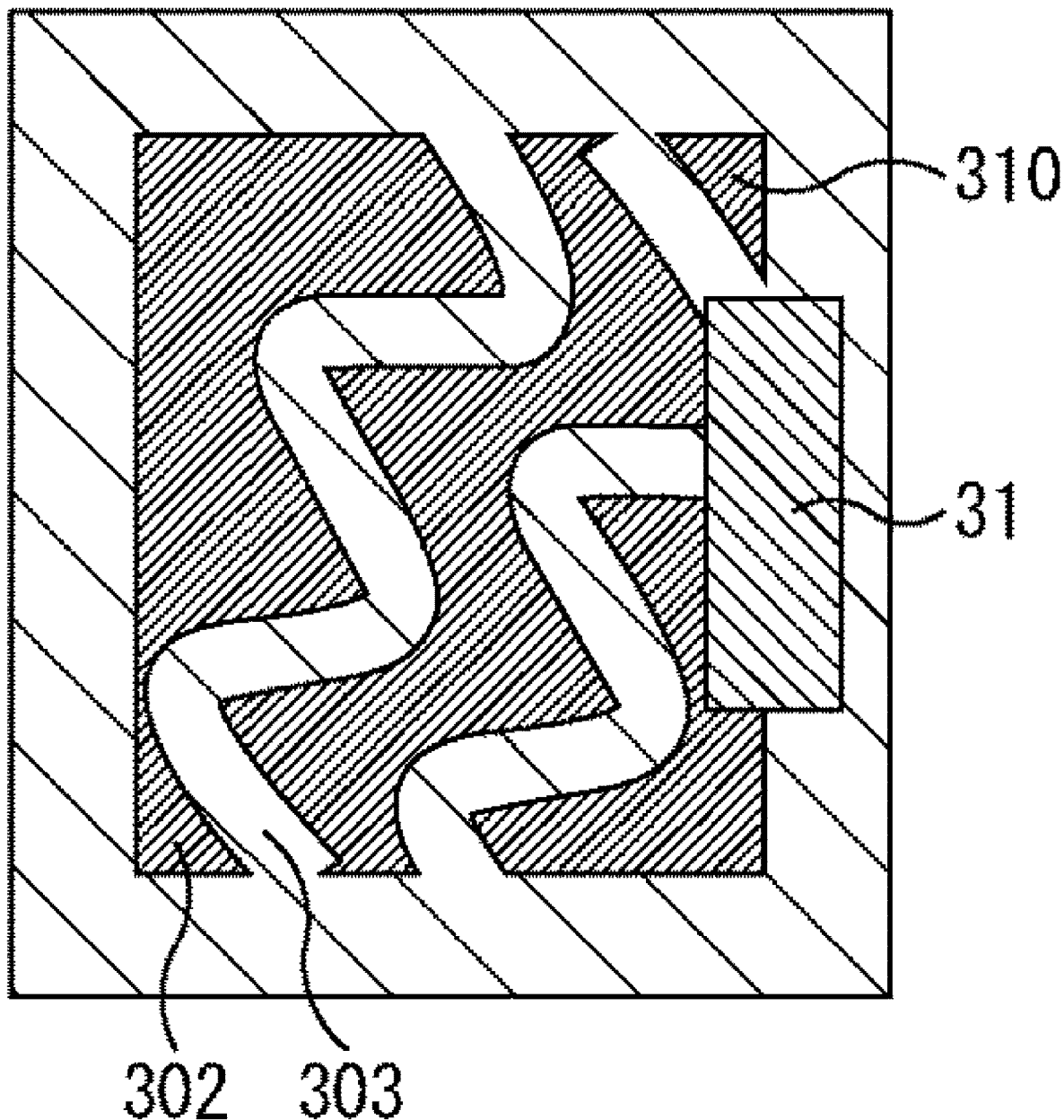
FIG. 24 is a view showing an example of a shape of an N+ region in a PN junction capacity expansion part.

The N+ regions 302 of the PN junction capacity expansion part 310 shown in FIG. 24 fill the regions excluding the P+ regions 303 each provided in a wavy shape (curved shape) with a predetermined (or alternatively, desired) width within the PN junction capacity expansion part 310.

Figure 25:
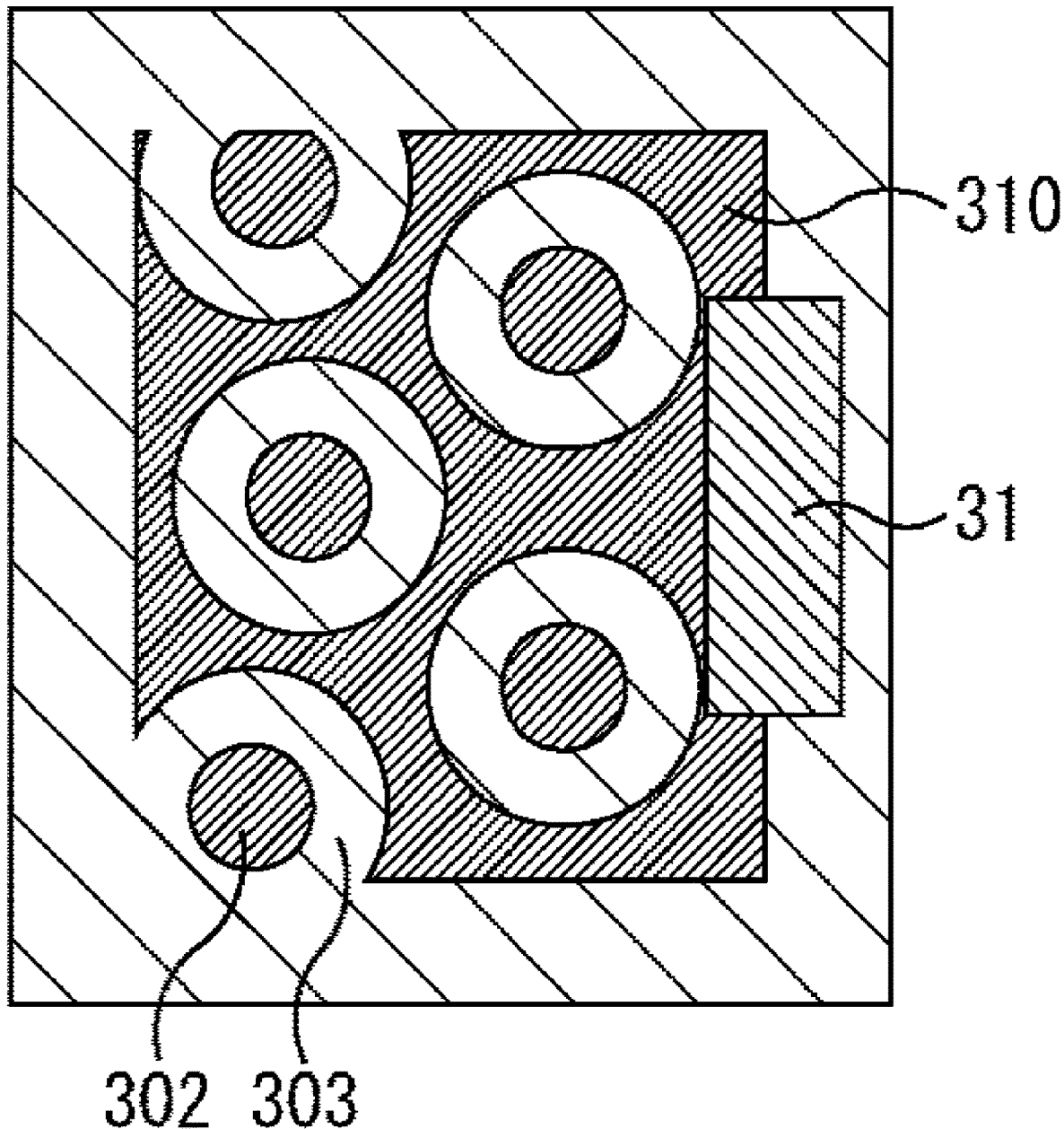
FIG. 25 is a view showing an example of a shape of an N+ region in a PN junction capacity expansion part.

The N+ regions 302 of the PN junction capacity expansion part 310 shown in FIG. 25 fill the regions excluding the P+ regions 303 each provided in a circle with a predetermined (or alternatively, desired) width within the PN junction capacity expansion part 310.

Figure 26:
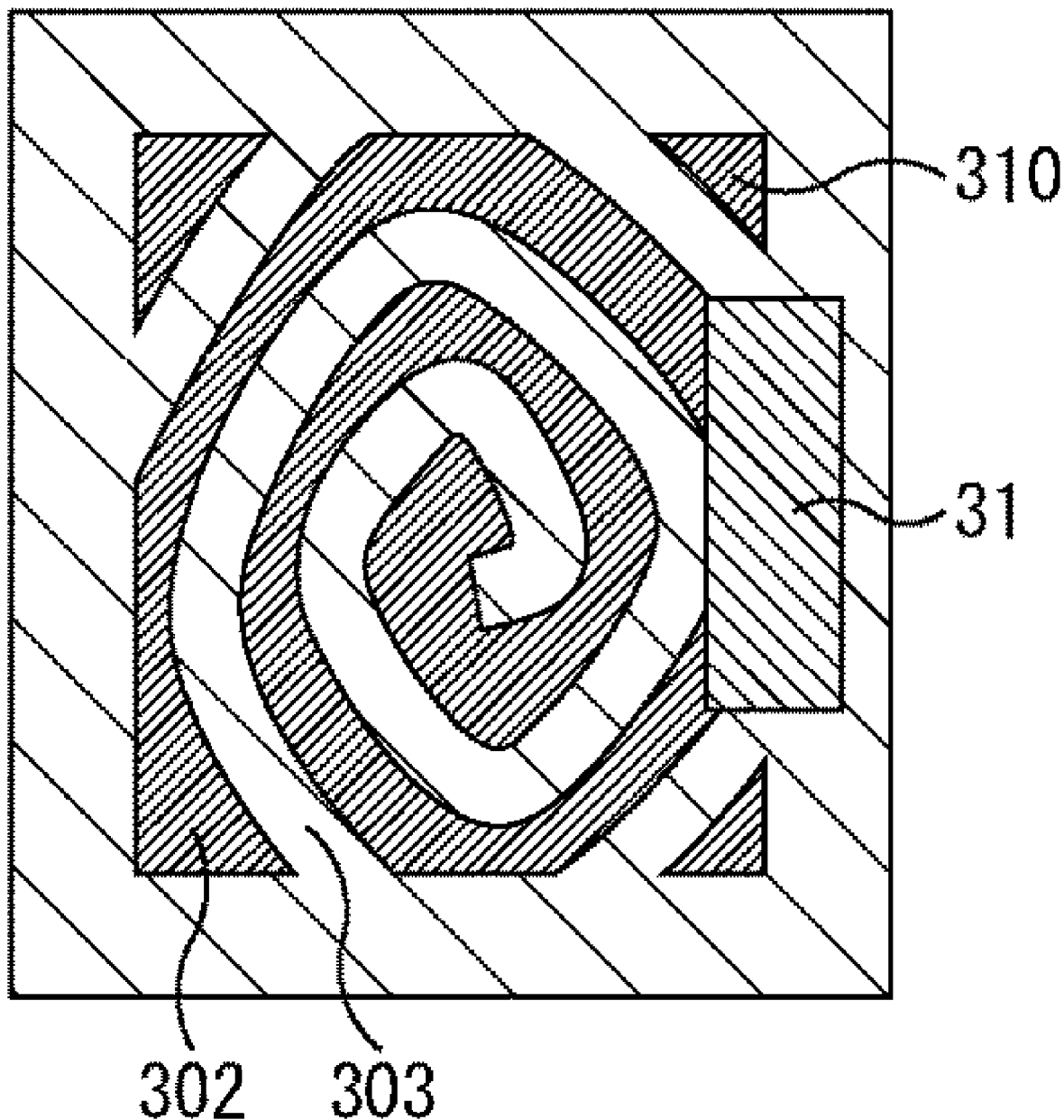
FIG. 26 is a view showing an example of a shape of an N+ region in a PN junction capacity expansion part.

The N+ regions 302 of the PN junction capacity expansion part 310 shown in FIG. 26 fill the regions excluding the P+ regions 303 each provided in a spiral shape with a predetermined (or alternatively, desired) width within the PN junction capacity expansion part 310.

As above, the shapes of the N+ regions 302 in the PN junction capacity expansion part 310 (the shapes of the P+ regions 303 in the PN junction capacity expansion part 310) may be a variety of shapes including a lattice, a bar and a curve. Also, it may be line symmetry, point symmetry, or asymmetry.

Note that the shapes shown FIG. 11C, FIG. 13 to FIG. 26 are illustrative, not limitative, and may be other shapes to which the present technology is applicable.

However, the shape may preferably satisfy the conditions as described below. As described above, the pitch distance of the PN junction capacity expansion part 310 is 1.0 µm or less. In addition, a ratio of the N+ regions 302 and the P+ regions 303 is equivalent (1:1) or the number of the N+ regions 302 may be slightly greater than that of the P+ regions 303 within the PN junction capacity expansion part 310.

In the following description, the structure of the PN junction capacity expansion part 310 shown in FIG. 11C will be described as an example.

<Improvement of Saturated Signal Electric Charge Quantity>

As described above, in the image sensing device 300, the P type impurity region 330, the N type impurity region 320 and the PN junction capacity expansion part 310 are laminated, thereby improving the saturated signal electric charge quantity. Here, the improvement of the saturated signal electric charge quantity will be further described.

Figure 27:
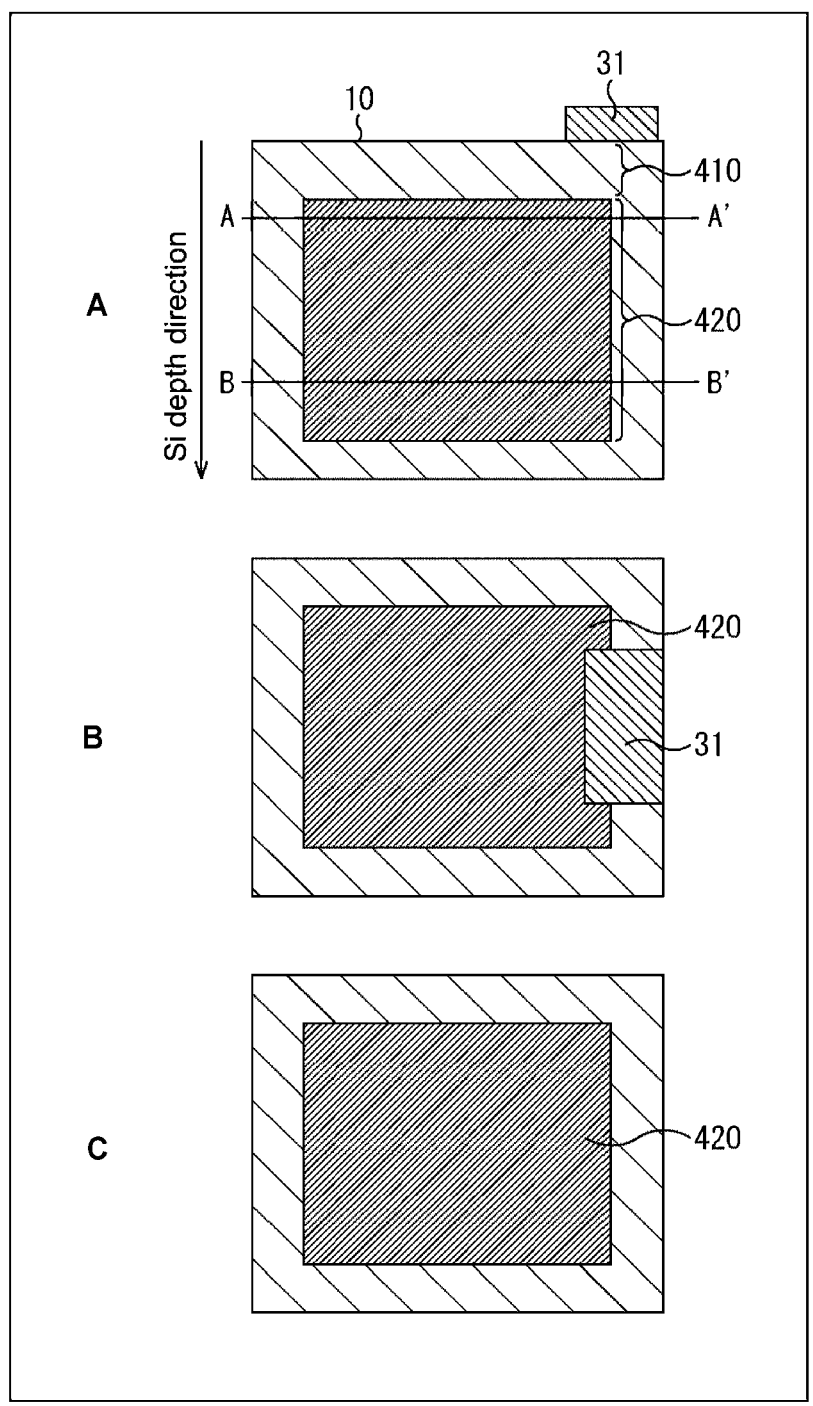
FIG. 27 is a cross-sectional view of the image sensing device shown in FIG. 1.

FIGS. 27A-27C show again the configuration of the image sensing device or pixel 10 shown in FIG. 1 as a reference (the image sensing device shown for comparing with the image sensing device or pixel 300 to which the present technology is applied). For comparing with the image sensing device 300 shown in FIGS. 11A-11C, FIG. 27A shows a cross-sectional view of a side of the image sensing device 10, FIG. 27B shows a cross-sectional view of the image sensing device 10 shown in FIG. 27A cut along A-A', and FIG. 27C shows a cross-sectional view of the image sensing device 10 shown in FIG. 27A cut along B-B'. For reference, the readout electrode 31 is also shown in FIG. 27B.

FIG. 27A is a cross-sectional view of the image sensing device 10 similar to that shown in FIG. 1. In the image sensing device 10 shown in the FIG. 27A, the P+ region 21 of the image sensing device 10 shown in FIG. 1 is described as a P type impurity region 410, and the N+ region 22 and the N− region 23 are collectively described as the N type impurity region 420.

As the image sensing device 10 has no region corresponding to the PN junction capacity expansion part 310, the P type impurity region 410 and the N type impurity region 420 are laminated as shown in FIG. 27A.

FIG. 27B is a cross-sectional view of the image sensing device 10 shown in FIG. 27A cut along A-A', and FIG. 27C is a cross-sectional view cut along B-B'. As to the image sensing device 10, FIG. 27B and FIG. 27C are cross-sectional views cut at different positions in the N type impurity region 420.

That is to say, as shown in FIG. 27B and FIG. 27C, N-type impurities are diffused uniformly in the cross section in the N type impurity region 420. Thus, the N-type impurity region 420 occupies a same amount of surface area in both cross sections shown in FIGS. 27B and 27C.

A relationship between the size of the image sensing device 10 and the saturated signal electric charge quantity will be described referring to FIGS. 28A-28C and FIG. 29.

Figure 28:
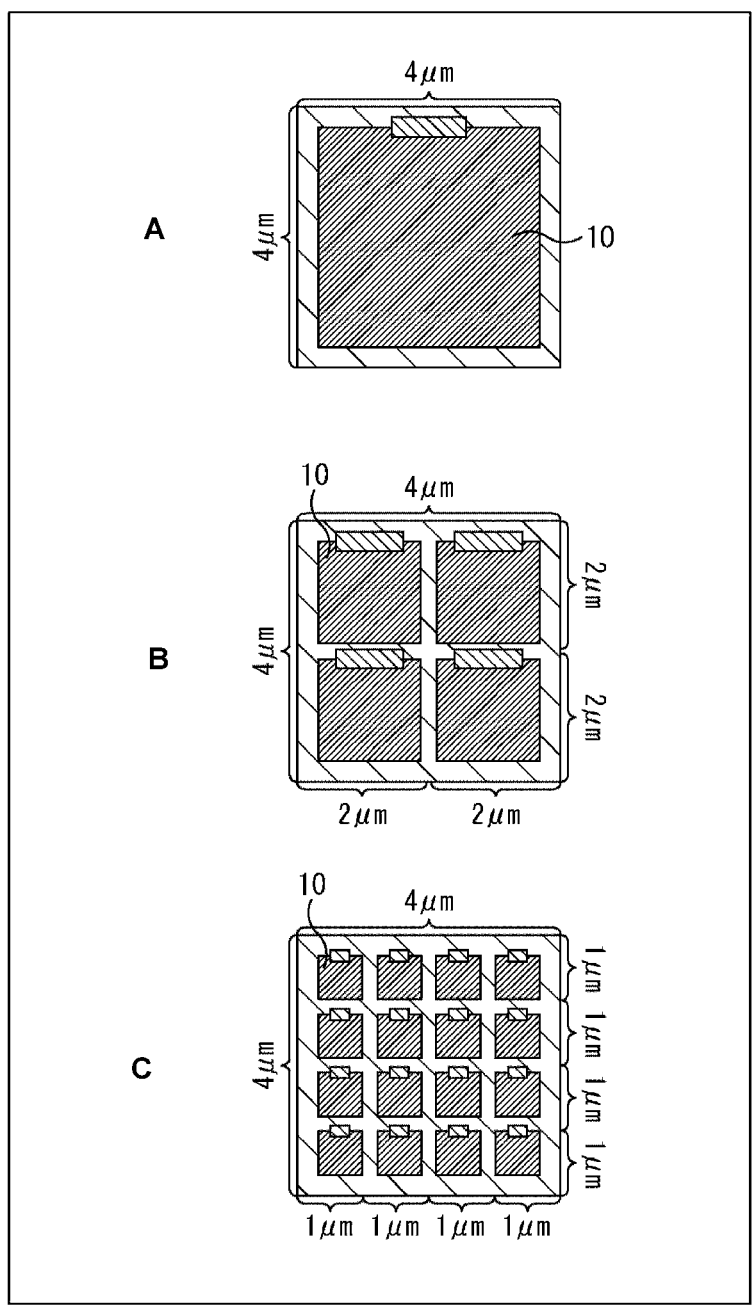
FIG. 28 is a view for explaining a size of 1 pixel.

FIGS. 28A-28C are top views of the image sensing device 10 cut along A-A' or B-B' in FIG. 27B or FIG. 27C. FIGS. 28A-28C include 1 pixel, 4 pixels and 16 pixels in a 4 μm×4 μm, and each pixel has the configuration of the image sensing device 10 shown in FIG. 1 (FIGS. 27A-27C).

As the image sensing device 10 shown in FIG. 28A includes 1 pixel within 4 μm×4 μm, 1 pixel has a size of 4 μm×4 μm. Hereinafter, the image sensing device 10 having a size of 4 μm×4 μm is in a status "A".

As the image sensing device 10 shown in FIG. 28B includes 4 pixels within 4 μm×4 μm, 1 pixel has a size of 2 μm×2 μm. Hereinafter, the image sensing device 10 having a size of 2 μm×2 μm is in a status "B". As the image sensing device 10 shown in FIG. 28C includes 16 pixels within 4 μm×4 μm, 1 pixel has a size of 1 μm×1 μm. Hereinafter, the image sensing device 10 having a size of 1 μm×1 μm is in a status "C".

Figure 29:
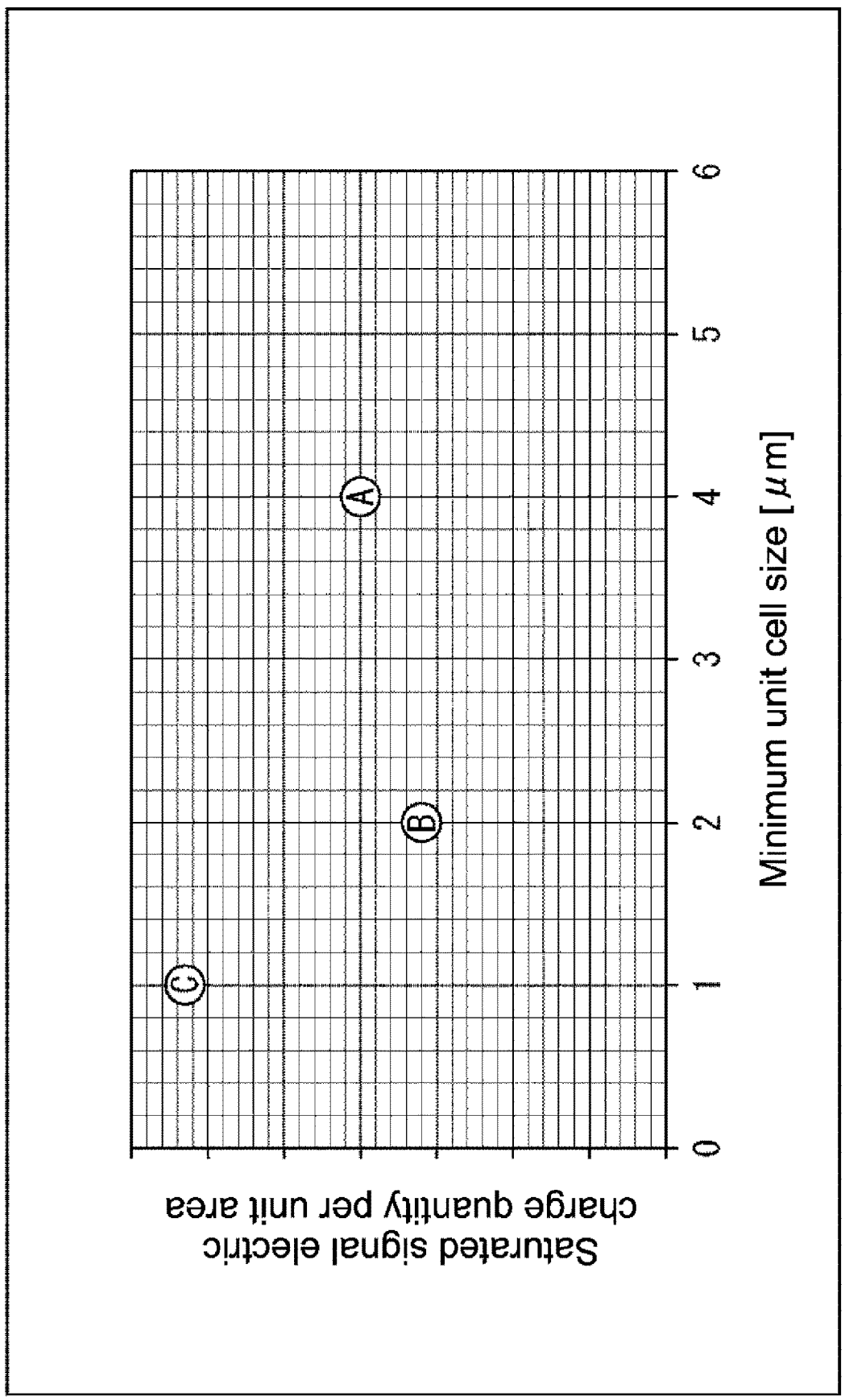
FIG. 29 is a diagram for explaining a relationship between a size of a pixel and a saturated signal electric charge quantity.

FIG. 29 is a graph showing a change of saturation when the same potential is achieved in the image sensing device 10 in the status "A", the status "B", and the status "C". In the graph shown in FIG. 29, a horizontal axis represents a minimum unit cell size (size of 1 pixel) and a vertical axis represents the saturated signal electric charge quantity per unit area. In the graph shown in FIG. 29, the saturated signal electric charge quantities per unit area in the status "A", the status "B", and the status "C" are shown by points (circled A, B and C are attached in the figure).

When the saturated signal electric charge quantity per unit area in the status "A" of the image sensing device 10 is compared with the saturated signal electric charge quantity per unit area in the status "B" of the image sensing device 10, the saturated signal electric charge quantity per unit area in the status "A" is greater than the saturated signal electric charge quantity per unit area in the status "B". When the saturated signal electric charge quantity per unit area in the status "A" of the image sensing device 10 is compared with the saturated signal electric charge quantity per unit area in the status "C" of the image sensing device 10, the saturated signal electric charge quantity per unit area in the status "A" is greater than the saturated signal electric charge quantity per unit area in the status "C". When the saturated signal electric charge quantity per unit area in the status "B" of the image sensing device 10 is compared with the saturated signal electric charge quantity per unit area in the status "C" of the image sensing device 10, the saturated signal electric charge quantity per unit area in the status "B" is greater than the saturated signal electric charge quantity per unit area in the status "C".

The change from the status "A" to the status "B" is that the pixel size becomes small, and the PN junction capacity is increased. Along with this change, the area of the P type impurity regions increases, and the area of the N type impurity regions relatively decreases. The effect is that the saturated signal electric charge quantity per unit area may be decreased. The change from the status "B" to the status "C" is that the pixel size becomes smaller. Along with this change, the area of the N type impurity regions decreases, and the N junction capacity increases. The effect is that the saturated signal electric charge quantity per unit area may be increased.

From the above relationship, it should be understood that as the pixel size becomes minute, the saturated signal electric charge quantity per unit area may tend to increase. If the pixel size is not minute at a suitable size, the saturated signal electric charge quantity per unit area may not increase.

Specifically, when the pixel size is 1.0 μm or less, the saturated signal electric charge quantity per unit area can increase. As described above, the pitch distance of the PN junction capacity expansion part 310 of the image sensing device 300 to which the present technology is applied is 1.0 μm or less as an example.

When the size of the image sensing device 300 to which the present technology is applied is 4 μm×4 μm, the configuration will be shown in FIGS. 30A and 30B. FIG. 30A is similar FIG. 11B, and is a cross-sectional view that the image sensing device 300 shown in FIG. 11A is cut along A-A'. FIG. 30B shows a cross-sectional view of the image sensing device 300 shown in FIG. 11A cut along B-B'. For reference, the readout electrode 31 is also shown in FIG. 30A.

The image sensing device 300 shown in FIG. 30A is a cross section (e.g., lateral cross section) of the N type impurity region 320, and includes 1 pixel N type impurity region 320 within 4 μm×4 μm. The N type impurity region 320 having the size of 4 μm×4 μm is in a status "D".

The image sensing device 300 shown in FIG. 30B is a cross section (e.g., lateral cross section) of the PN junction capacity expansion part 310, and includes 1 μm×1 μm (accurately, 1 μm×1 μm or less) 16 N+ regions 302 within 4 μm×4 μm. The state that 1 μm×1 μm 16 N+ regions 302 are formed within 4 μm×4 μm in a status "E".

The image sensing device 300 has the N type impurity region 320 in the status "D" at a readout electrode 31 side, and the PN junction capacity expansion part 310 in the status "E" far from the readout electrode 31 (at a deep substrate). Specifically, the image sensing device 100 has a configuration that different statuses "D" and "E" in 1 pixel.

The status "D" (FIG. 30A) is same as the status "A" in FIG. 28A, and the status "E" (FIG. 30B) is same as the status "C" in FIG. 28C. The image sensing device 300 has a configuration equivalent to 1 pixel near the readout electrode 31 (e.g., in FIG. 30A), and a configuration equivalent to multiple minute pixels far therefrom (e.g., in FIG. 30B).

Figure 31:
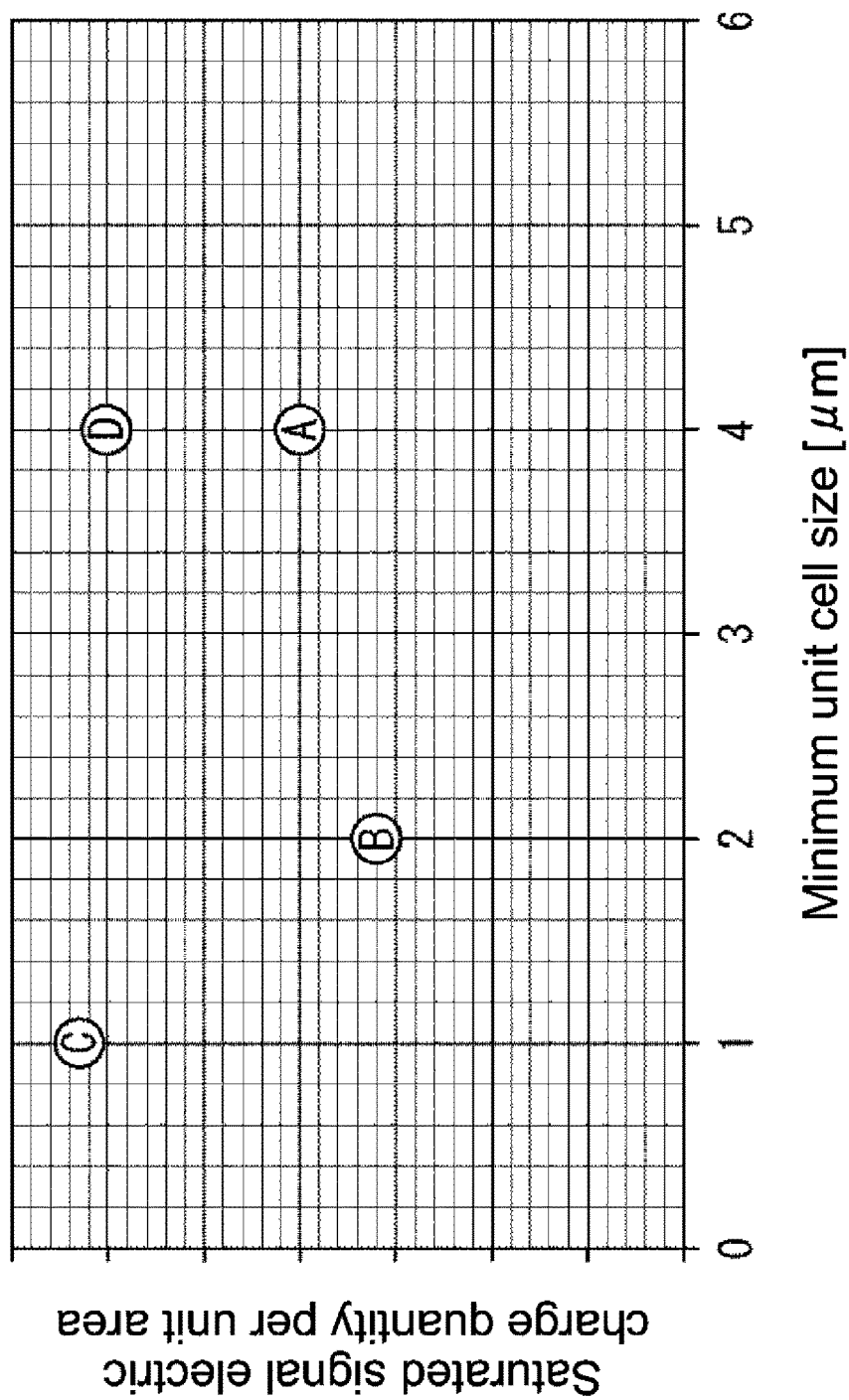
FIG. 31 is a diagram for explaining a relationship between a size of a pixel and a saturated signal electric charge quantity.

FIG. 31 is a graph showing a change of saturation when the same potential is achieved in the image sensing device 10 in the status "A", the status "B", and the status "C" to which the saturated signal electric charge quantity per unit area of the image sensing device 300 is added.

The image sensing device 300 includes a pixel in the status "D" in FIG. 30A, and functions as 1 pixel having a size of 4 μm×4 μm. FIG. 31 shows the saturated signal electric charge quantity per unit area in the status "D".

Referring to FIG. 31, the image sensing device 300 has the size similar to that of the image sensing device 10 in the status "A", but the saturated signal electric charge quantity per unit area is similar to that of the image sensing device 10 in the status "C" as shown by status "D". Thus, according to the image sensing device 300, the saturated signal electric charge quantity can be remarkably increased (e.g., from status "A" to status "D") as compared with the image sensing device having the same size to which the present technology is not applied in FIGS. 28A and 28B.

<Another Structure of Image Sensing Device>

Another structure of the image sensing device will be described.

Figure 32:
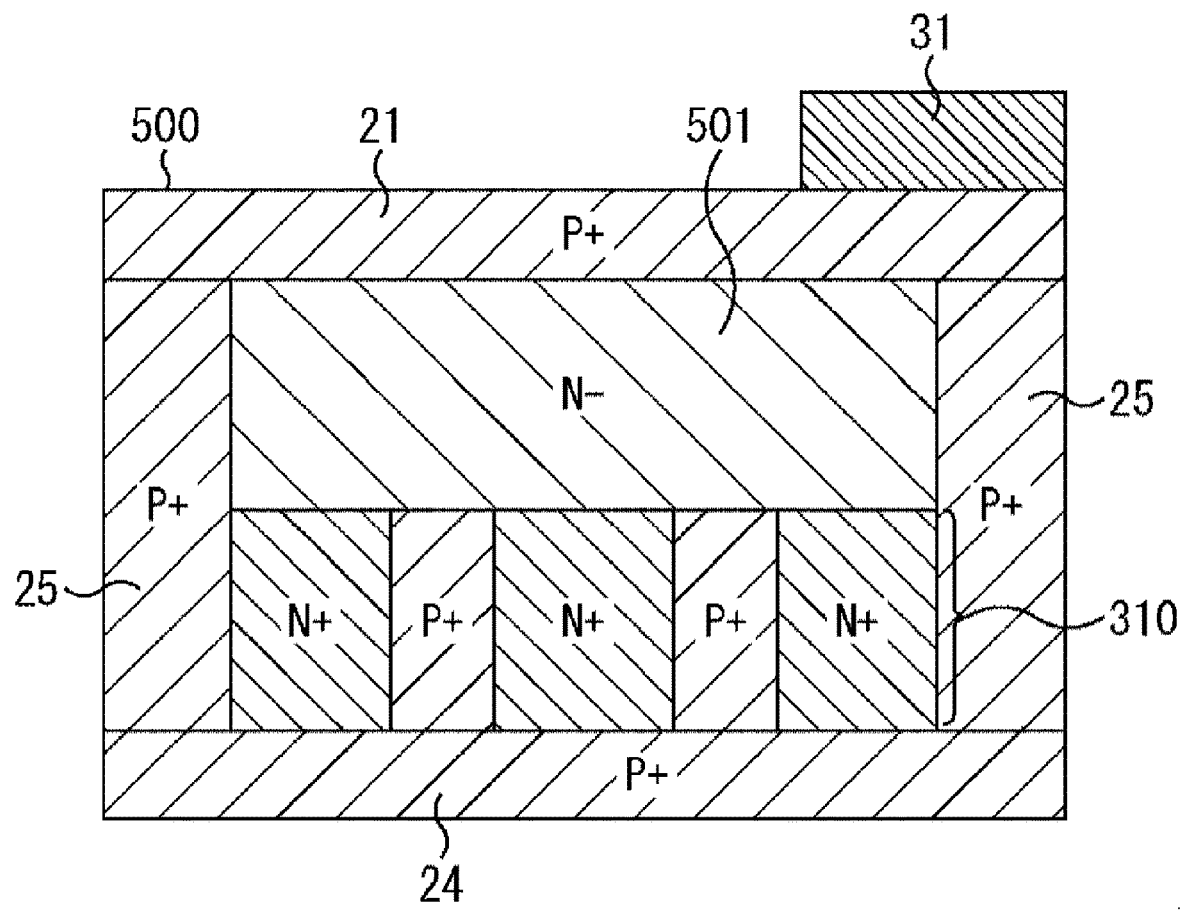
FIG. 32 is a view showing an example of a configuration of another image sensing device.

FIG. 32 is a view showing a configuration of another image sensing device to which the present technology is applied. A basic configuration of an image sensing device or pixel 500 shown in FIG. 32 is similar to that of the image sensing device 300 shown in FIG. 9, but is different in that no N+ region 22 is provided, and the N type impurity region is configured only of an N− region 501. In the image sensing device 500, the concentration of the N type impurity at the readout electrode 31 side is low. Also, in the image sensing device 500, the PN junction capacity expansion part 310 is disposed deeper than the N− region 501.

Figure 33:
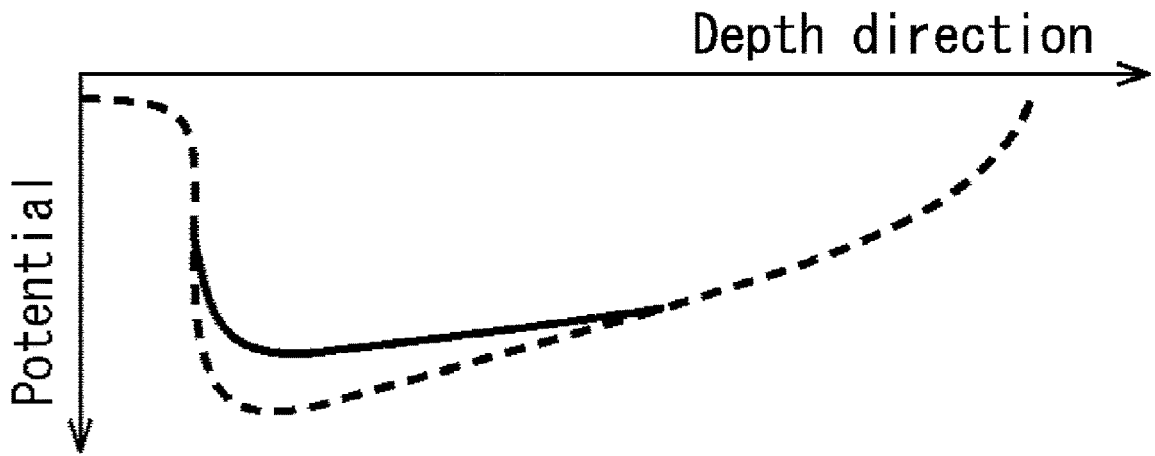
FIG. 33 is a diagram showing a relationship between a depth and a potential.

In this manner, when the concentration of the N type impurity at the readout electrode 31 side is low, the potential can be shallow. FIG. 33 is a diagram showing a relationship between a depth and a potential of the image sensing device 500 having the structure shown in FIG. 32. In FIG. 33, a dotted line represents the potential status of the image sensing device 10 shown in FIG. 2 by a solid line, and a solid line represents a potential status of the image sensing device 500.

When the concentration of the N type impurity at the readout electrode 31 side is low in the image sensing device 500, a depth at a potential peak start can be shallow as shown in FIG. 33.

In addition, as the image sensing device 500 has the PN junction capacity expansion part 310, the saturated signal electric charge quantity can be increased similar to the image sensing device 300.

The PN junction capacity expansion part 310 is disposed at a substrate side far from the readout electrode 31, thereby improving the saturated signal electric charge quantity. For example, when it is enough that the saturated signal electric charge quantity same as that in the related art, i.e., the saturated signal electric charge quantity provided by the image sensing device 10 shown in FIG. 1, is acquired, the potential is made to be shallow at the surface side of the substrate as in the image sensing device 500 shown in FIG. 32, thereby alleviating a surface electric field and improving a white spot.

By shallowing the potential, a readout capability of the readout electrode 31 can be improved, and the electric charge generated can be accurately readout. Furthermore, by shallowing the potential, a readout voltage can be decreased, thereby decreasing a power consumption.

Figure 34:
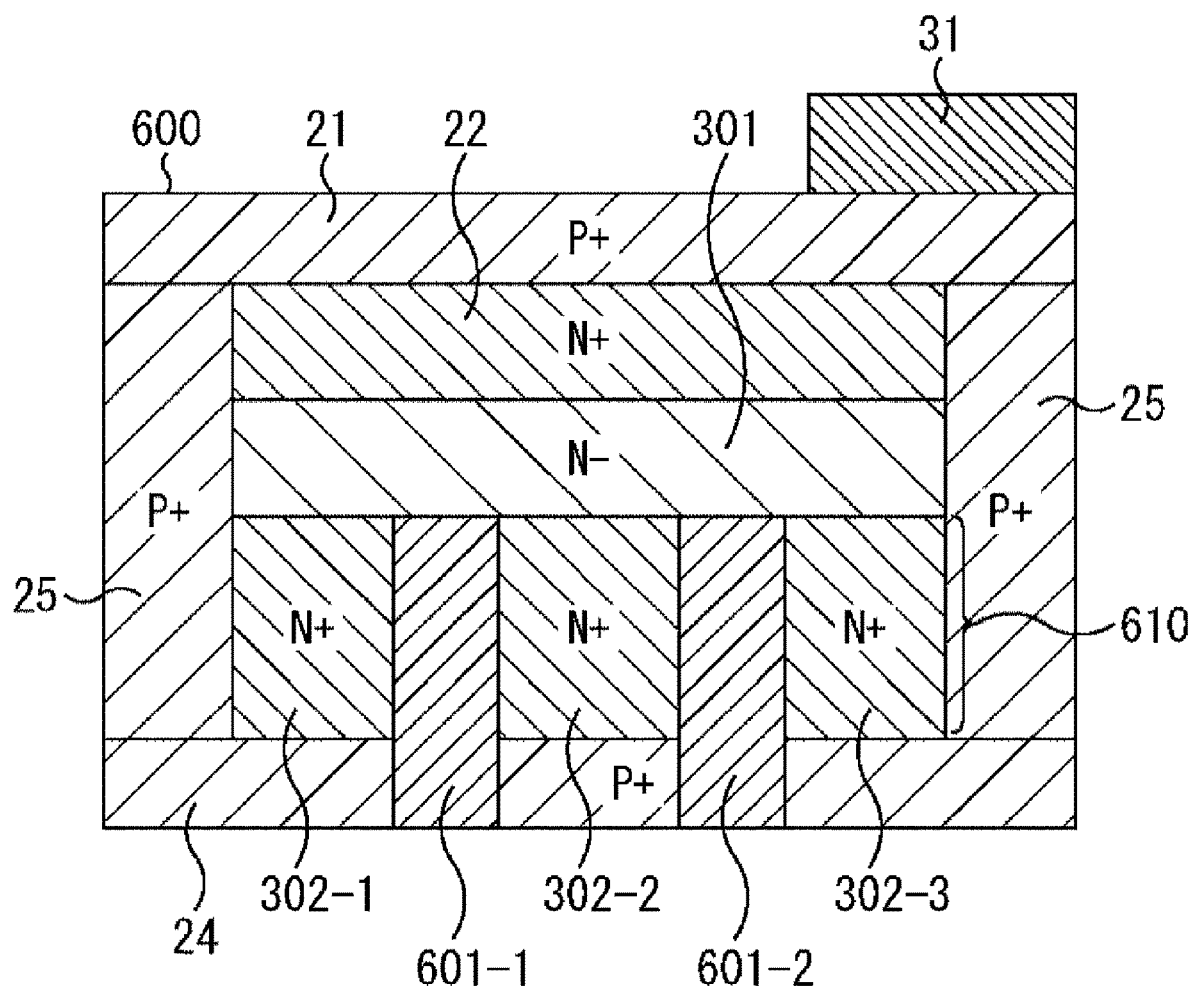
FIG. 34 is a view showing an example of a configuration of still another image sensing device.

FIG. 34 is a view showing a configuration of still another image sensing device to which the present technology is applied. A configuration of an image sensing device 600 shown in FIG. 34 is same as that of the image sensing device 300 shown in FIG. 9, but is different in terms of a material of the PN junction capacity expansion part 310 (FIG. 9).

A PN junction capacity expansion part 610 of the image sensing device 600 shown in FIG. 34 includes N+ regions 302 and P+ equivalent regions 601. The P+ equivalent regions 601 are regions equivalent to the P+ regions 303 PN of the junction capacity expansion part 310 in the image sensing device 300 shown in FIG. 9. The P+ equivalent regions 601 is filled with a material used as an insulation film, e.g., an oxide film, other than the impurities.

The material that fills the P+ equivalent region 601 may be any material that can fill an interface with silicon with holes by the work function when the image sensing device or pixel 600 is configured of a silicon substrate.

The P+ equivalent regions 601 are formed by forming grooves using a technique such as etching at the time of the production of the image sensing device 600, and filling the grooves with a material used as an insulation film, e.g., an oxide film.

When the P+ equivalent regions 601 are formed using a technique such as etching, P+ regions 24 are formed, the P+ regions 24 are grooved to the N− region 301 to form grooves, and the grooves are filed with the material for forming the P+ equivalent regions 601. When the P+ equivalent regions 601 are thus formed, as shown in FIG. 34, the P+ equivalent regions 601 are also formed in the P+ regions 24.

<Sharing Pixels>

In the above-described embodiments, one image sensing device is illustrated and described. For example, the image sensing devices or pixels 300 are disposed on a pixel array unit in a two-dimensional m×n array. When a plurality of the image sensing devices 300 are disposed, a plurality of pixels, e.g., 2 pixels or 4 pixels may share a floating diffusion (FD) (or charge accumulation region). In the image sensing device to which the present technology is applied, a multi-pixel sharing technology is applicable.

Figure 35:
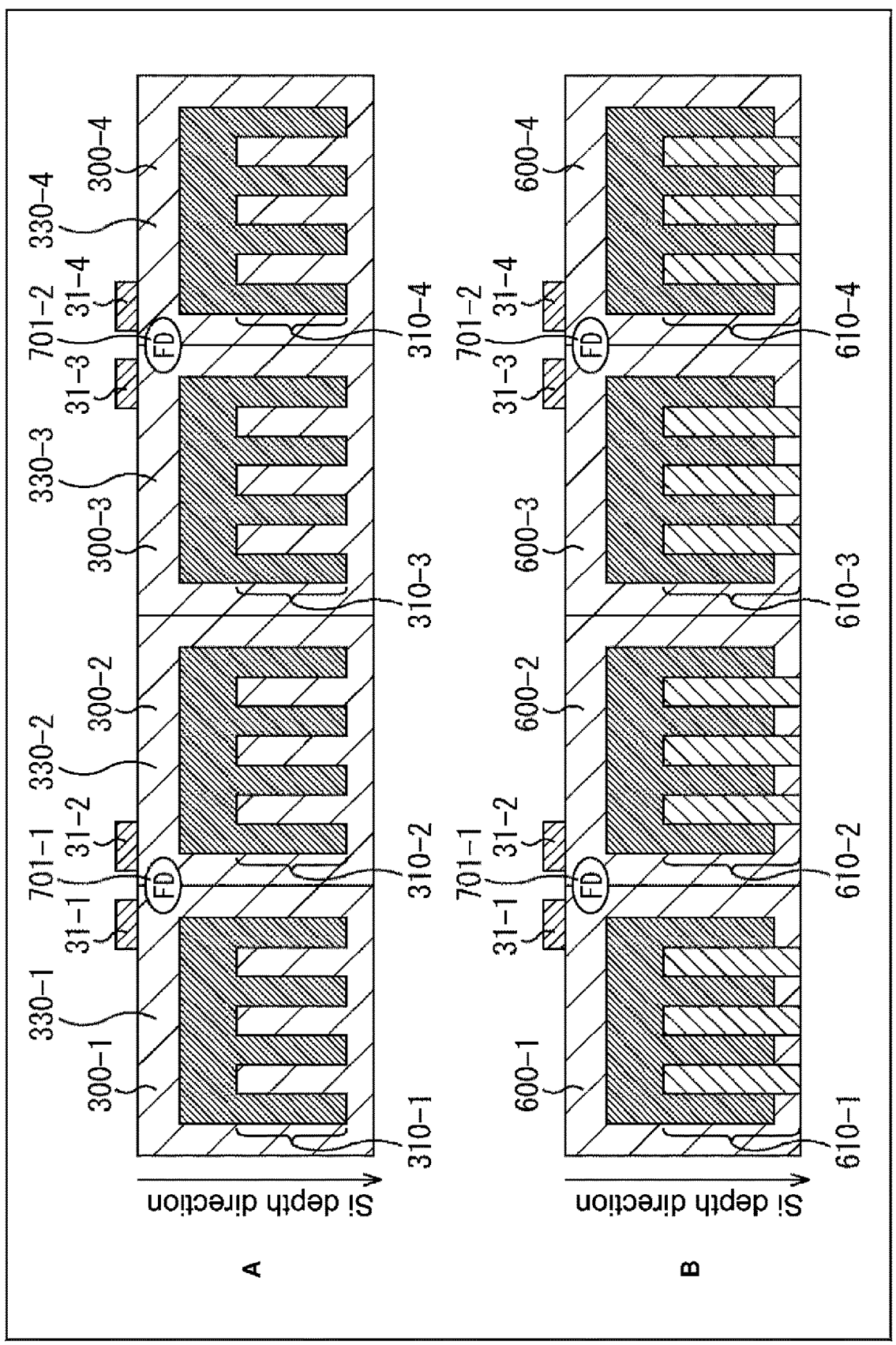
FIG. 35 is a view for explaining a structure shared by pixels.

FIGS. 35A and 35B show image sensing devices each including 4 pixels disposed on a pixel array unit in a horizontal direction. FIG. 35A shows that the image sensing devices 300 shown in FIG. 9 (FIG. 11A) each includes 4 pixels in a horizontal direction. On each of the image sensing devices 300-1 to 300-4, readout electrodes 31-1 to 31-4 are disposed at surface sides of substrates, and PN junction capacity expansion parts 310-1 and 310-4 are disposed at deep sides of the substrates.

FIG. 35B shows that the image sensing devices 600 shown in FIG. 34 each includes 4 pixels in a horizontal direction. On each of the image sensing devices 600-1 to 600-4, readout electrodes 31-1 to 31-4 are disposed at surface sides of the substrates, and PN junction capacity expansion parts 610-1 and 610-4 are disposed at deep sides of the substrates.

In the image sensing devices 300 and the image sensing devices 600 shown in FIGS. 35A and 35B (hereinafter, the description is continued by illustrating the image sensing devices 300), the readout electrodes 31 of adjacent image sensing devices 300 are disposed adjacent.

For example, the readout electrode 31-1 and the readout electrode 31-2 of the image sensing device 300-1 and the image sensing device 300-2 adjacent are disposed adjacent. Similarly, the readout electrode 31-3 and the readout electrode 31-4 of the image sensing device 300-3 and the image sensing device 300-4 adjacent are disposed adjacent.

The image sensing device 300-1 and the image sensing device 300-2 disposed adjacent share one floating diffusion (FD) 701-1. Similarly, the image sensing device 300-3 and the image sensing device 300-4 disposed adjacent share one floating diffusion (FD) 701-2.

The floating diffusion 701-1 is disposed between the readout electrode 31-1 and the readout electrode 31-2. The floating diffusion 701-1 is disposed over a P type impurity region 330-1 and a P type impurity region 330-2. In FIG. 35A, there is a line between the P type impurity region 330-1 and the P type impurity region 330-2 to clarify a boundary.

The line is added for description, there is no such a line between the type impurity region 330-1 and P type impurity region 330-2.

Similarly, a floating diffusion 701-2 is disposed between the readout electrode 31-3 and the readout electrode 31-4. The floating diffusion 701-2 is disposed over a P type impurity region 330-3 and a P type impurity region 330-4. In view of FIGS. 35A and 35B, it may be said that a first pixel (e.g., image sensing device 300-1) and a second pixel (e.g., image sensing device 300-2) are adjacent to one another and the floating diffusion (or the charge accumulation region) 701-1 is between a first electrode (e.g., readout electrode 31-1) and a second electrode (e.g., readout electrode 31-2).

Figure 36:
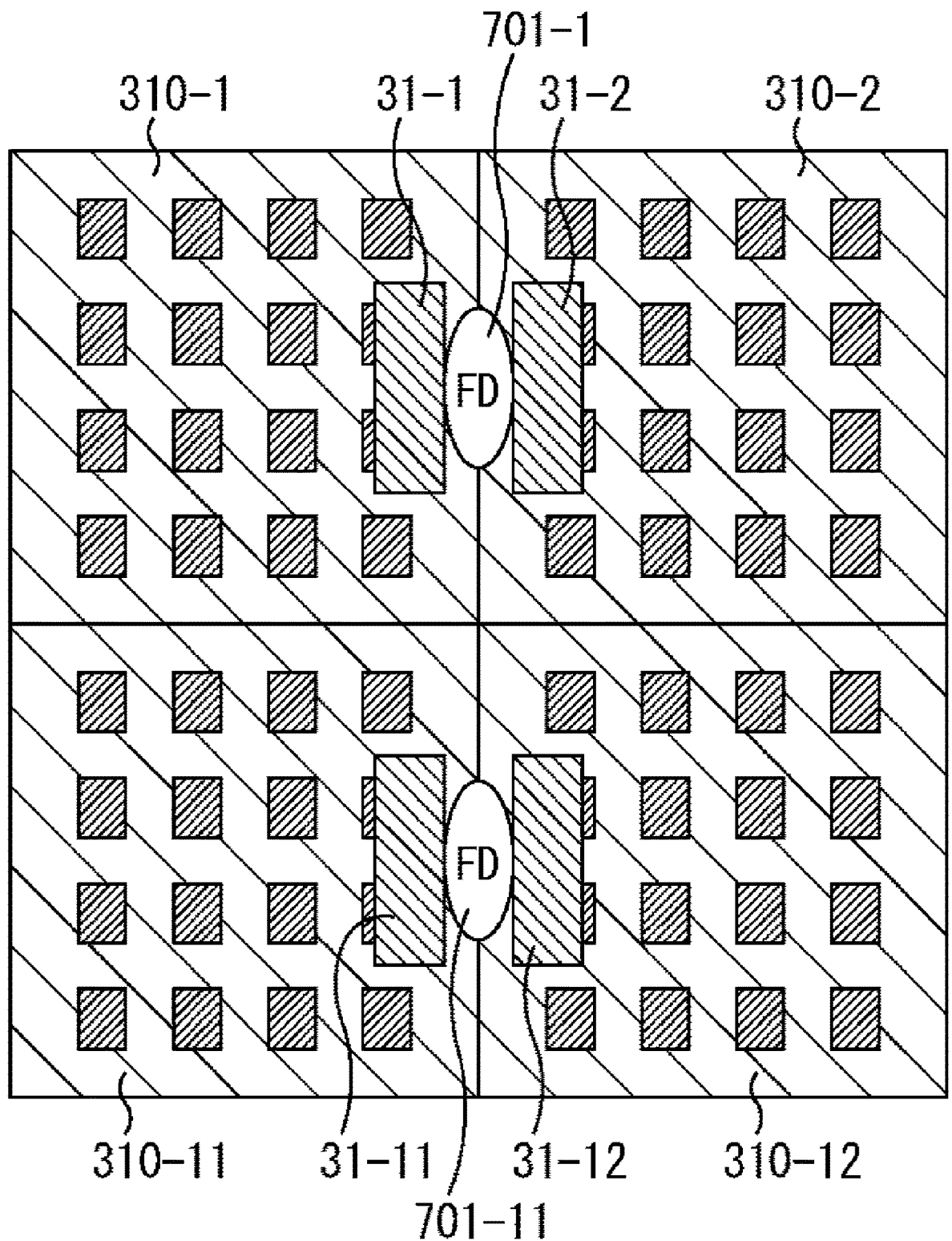
FIG. 36 is a view for explaining a structure shared by pixels.

FIG. 36 is a top view of the image sensing device 300 shown in FIG. 35A, and a cross-sectional view of a part of the PN junction capacity expansion part 310. For description, the readout electrode 31 is also shown. FIG. 36 shows the image sensing device 300 including 2×2=4 pixels.

The image sensing device 300-1 (PN junction capacity expansion part 310-1) and the image sensing device 300-2 (PN junction capacity expansion part 310-2) are adjacent in a horizontal direction, the 2 pixels share one floating diffusion (FD) (or charge accumulation region) 701-1. The floating diffusion 701-1 is disposed between the readout electrode 31-1 of the image sensing device 300-1 and the readout electrode 31-2 of the image sensing device 300-2.

Similarly, the image sensing device 300-11 (PN junction capacity expansion part 310-11) and the image sensing device 300-12 (PN junction capacity expansion part 310-12) are adjacent in a horizontal direction, and 2 pixels share one floating diffusion 701-11. The floating diffusion 701-11 is disposed between the readout electrode 31-11 of the image sensing device 300-11 and the readout electrode 31-12 of the image sensing device 300-12.

In this manner, 2 pixels adjacent can share one floating diffusion 701.

Figure 37:
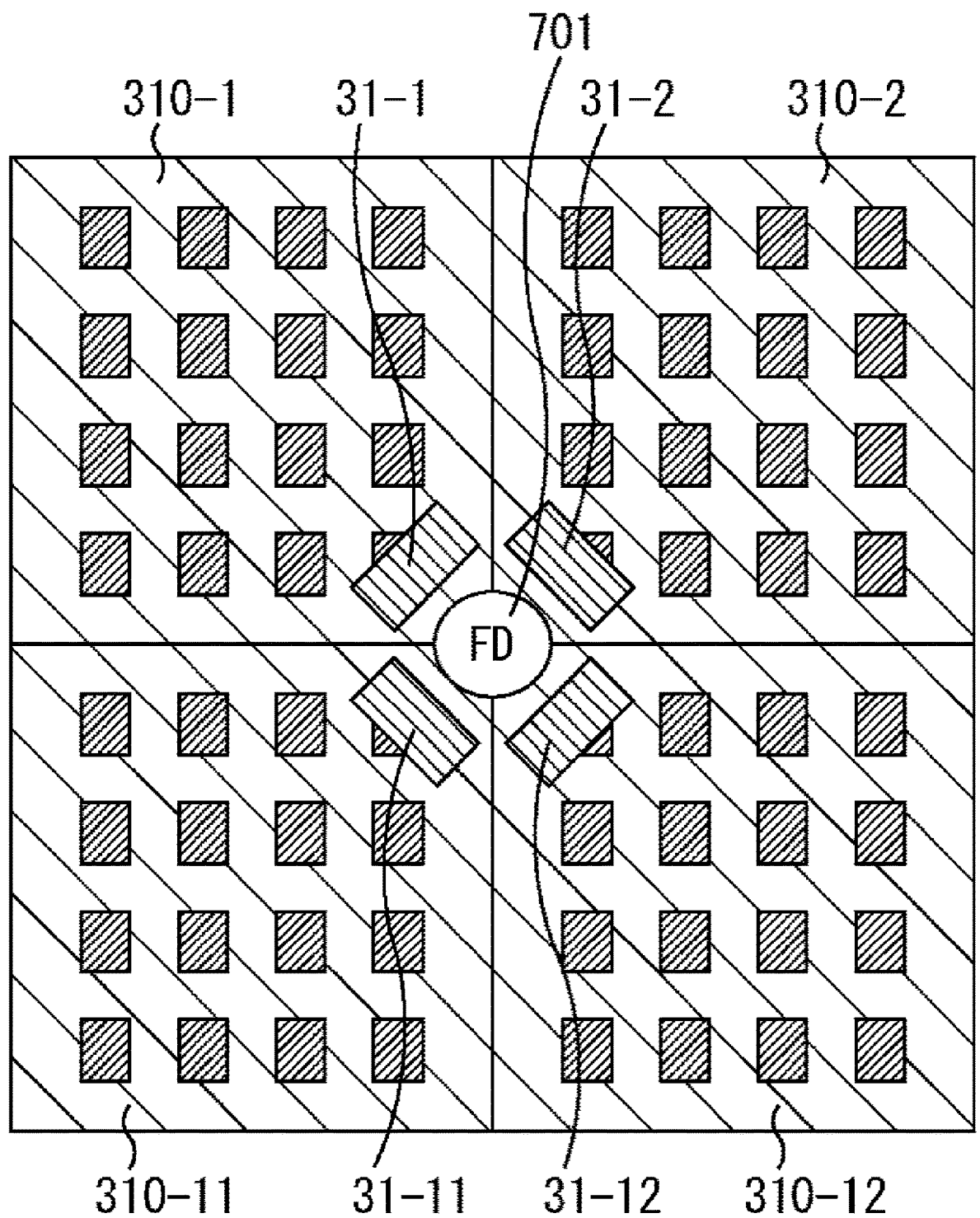
FIG. 37 is a view for explaining a structure shared by pixels.

4 pixels can share one floating diffusion 701. FIG. 37 shows the image sensing device 300 where 4 pixels share one floating diffusion 701.

FIG. 37 shows the image sensing device 300 including 2×2, 4 pixels same as in FIG. 36. 4 pixels share one floating diffusion 701. As shown in FIG. 37, the floating diffusion 701 is disposed at a center of 4 pixels.

Surrounding the floating diffusion 701, the readout electrode 31-1 of the image sensing device 300-1 (PN junction capacity expansion part 310-1), the readout electrode 31-2 of the image sensing device 300-2 (PN junction capacity expansion part 310-2), the readout electrode 31-11 of the image sensing device 300-11 (PN junction capacity expansion part 310-11), and the readout electrode 31-12 of the image sensing device 300-12 (PN junction capacity expansion part 310-12) are disposed.

In this manner, 4 pixels adjacent can share one floating diffusion 701. In other words, a first pixel (e.g., image sensing device 310-1), a second pixel (e.g., image sensing device 310-2), a third pixel (e.g., image sensing device 310-11) and a fourth pixel (e.g., image sensing device 310-12) are in a 2×2 matrix, and the charge accumulation region 701 is at a center portion of the 2×2 matrix. Further, the charge accumulation region 701 is surrounded by a first electrode (e.g., readout electrode 31-1), a second electrode (e.g., readout electrode 31-2), a third electrode (e.g., readout electrode 31-11) and a fourth electrode (e.g., readout electrode 31-12).

According to the present technology, as described above, the readout electrode 31 has high degree of freedom as to the position. When 2 pixels or 4 pixels share one floating diffusion 701, the readout electrode 31 can be disposed at an appropriate position, as described above.

According to the present technology, the saturated signal electric charge quantity in the image sensing device can be improved, as described above. Furthermore, even when it is configured such that the saturated signal electric charge quantity is improved, the size of the image sensing device is not increased compared to related art devices.

<Use Example of Image Sensing Device>

Figure 38:
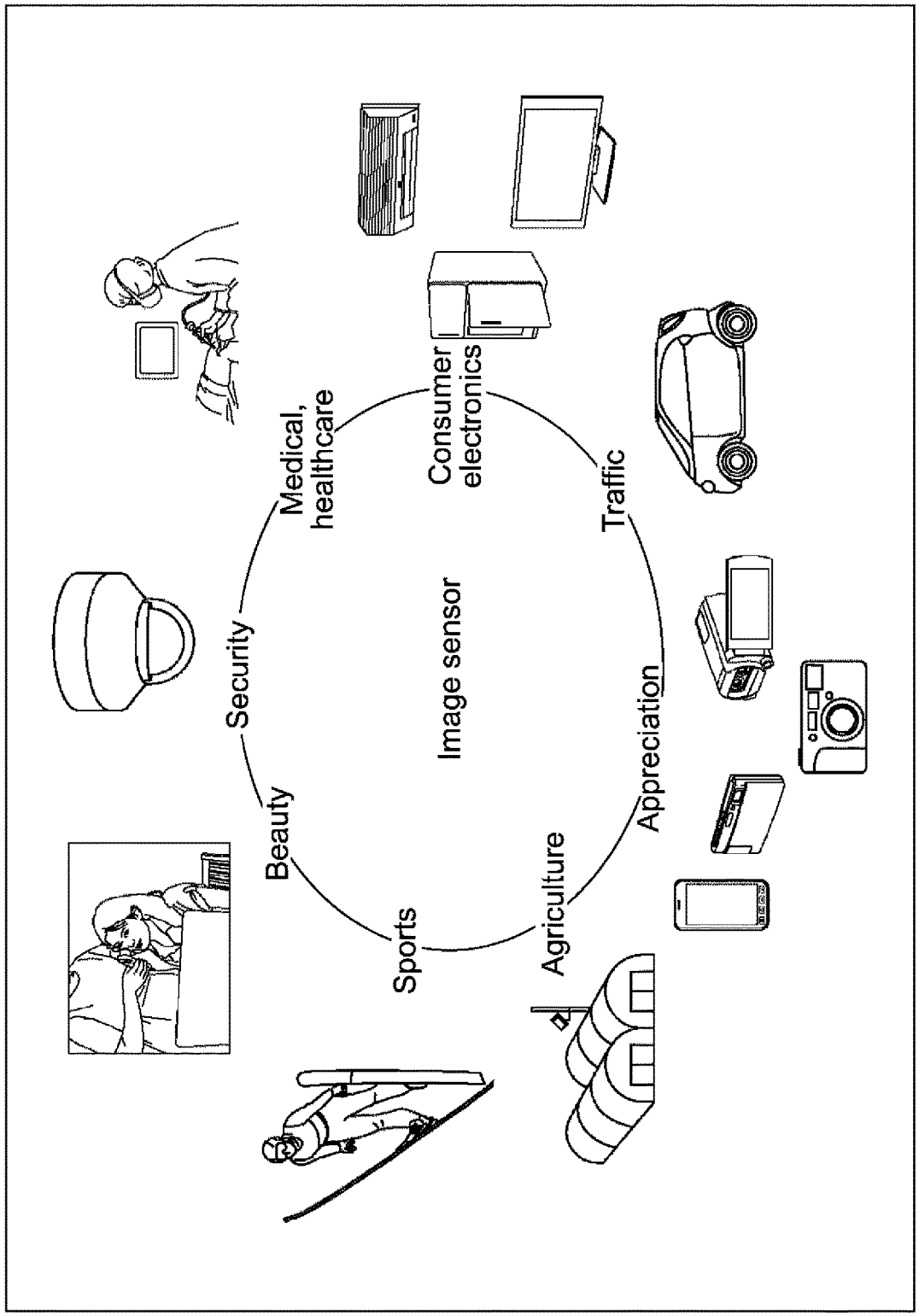
FIG. 38 is a diagram showing an example use of the image sensing device.

FIG. 38 is a diagram showing example uses of the image sensing device described above.

The image sensing device or apparatus described above can be used in a variety of cases where light such as visible rays, infrared rays, ultraviolet rays, and X rays is sensed, for example, as described below:

An imaging apparatus according to at least one embodiment may be used for viewing and may include a digital camera and/or a portable device having a camera. An imaging apparatus according to at least one embodiment may be used for traffic and may include a vehicle-mounted sensor for imaging a front, a back, surroundings and inside of a vehicle for the purpose of a safety drive of an automatic stop or identification of a driver's status. An imaging apparatus according to at least one embodiment may be used as a monitoring camera for monitoring a running vehicle and a road, and a distance finding sensor for measuring a distance between vehicles. An imaging apparatus according to at least one embodiment may be used in consumer electrical appliances including a TV, a refrigerator, and an air conditioner for the purpose of appliance operation by a user's gesture imaged. An imaging apparatus according to at least one embodiment may be used in a health care or medical apparatus including an endoscope and an angiography by receiving infrared rays. An imaging apparatus according to at least one embodiment may be used in a security apparatus including a security monitoring camera and a personal authentication camera. An imaging apparatus according to at least one embodiment may be used in a beauty apparatus including a skin diagnosis apparatus and a scalp microscope. An imaging apparatus according to at least one embodiment may be used in a sports apparatus including an action camera and a wearable camera for use in sports. An imaging apparatus according to at least one embodiment may be used in an agricultural apparatus including a camera for monitoring a field and crop status.

Figure 39:
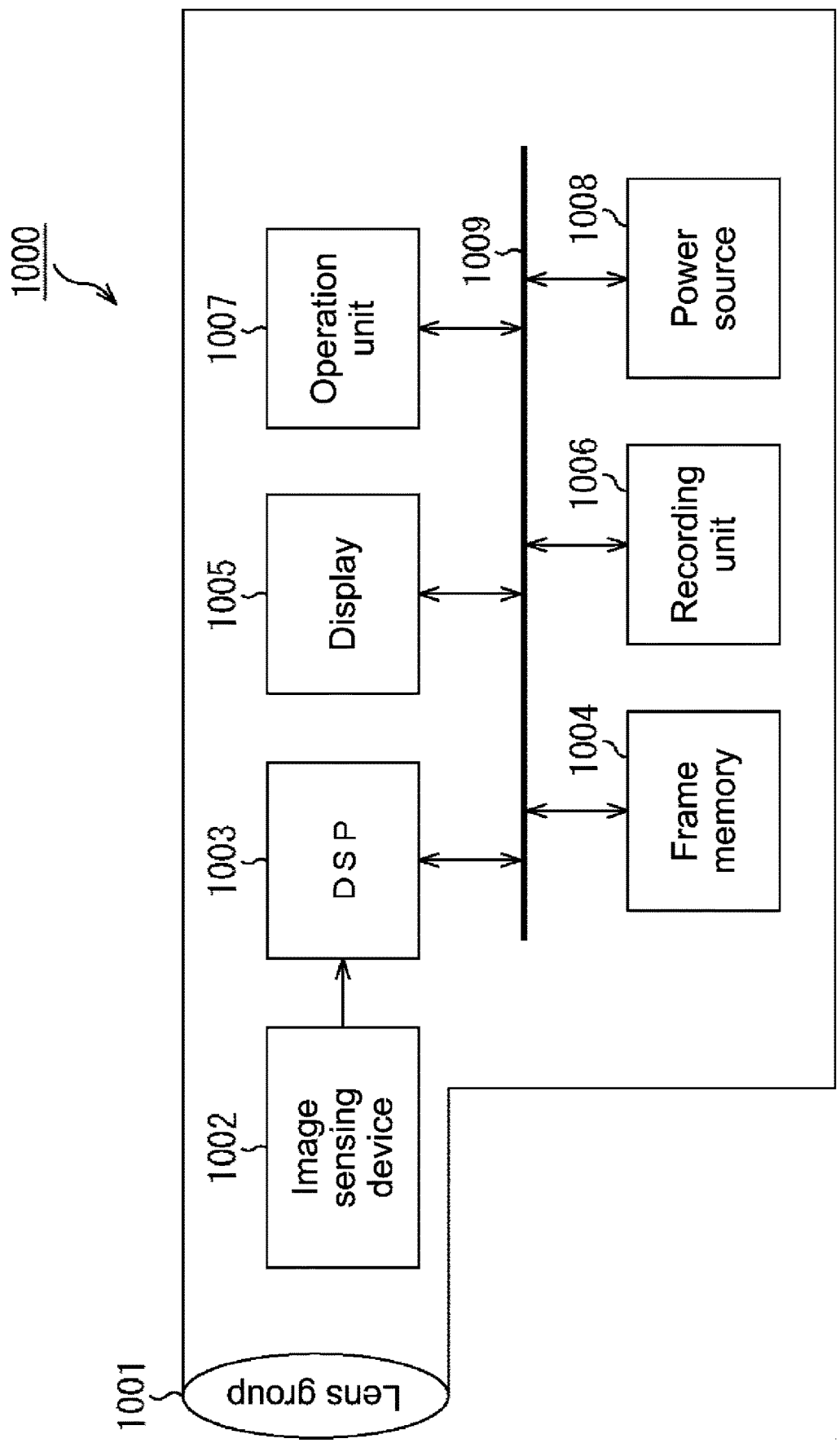
FIG. 39 is a diagram showing a structure of the image sensing apparatus.

FIG. 39 is a block diagram showing a configuration example of an image sensing apparatus (camera apparatus) 1000 as an example of an electronic device to which the present technology is applied.

As shown in FIG. 39, the image sensing apparatus or imaging apparatus 1000 includes an optical system having a lens group 1001, an image sensing device 1002 in an imaging device, a camera signal processing unit DSP 1003, a frame memory 1004, a display 1005, a recording unit 1006, an operation unit 1007, and a power source 1008. The DSP 1003, the frame memory 1004, the display 1005, the recording unit 1006, the operation unit 1007, and the power source 1008 are mutually connected via a bus line 1009.

The lens group 1001 takes an incident light (imaging light) from an object to be imaged, and images on an imaging surface of the image sensing device 1002. The image sensing device 1002 converts an amount of incident light imaged on the imaging surface by the lens group 1001 into an electrical signal per pixel to output a pixel signal.

The display 1005 is configured of a panel display such as a liquid crystal display and an organic electro luminescence (EL) display, and displays video or a still picture imaged by the image sensing device 1002. The recording unit 1006 records the video or the still picture imaged by the image sensing device 1002 into a recording medium such as a memory card, a video tape and a DVD (Digital Versatile Disk).

The operation unit 1007 issues an operation command to a variety of functions of the image sensing apparatus 1000 under a user's operation. The power source 1008 provides appropriately a target to be supplied with a variety of power supplies for operation of the DSP s1003, the frame memory 1004, the display 1005, the recording unit 1006, and the operation unit 1007.

The image sensing apparatus 1000 is applied to a video camera, a digital still camera, and a camera module for a mobile device such as a smart phone and a portable phone. In the image sensing apparatus 1000, the image sensing device according to the above-described embodiments can be used as the image sensing device 1002. In this manner, an image quality of the image sensing apparatus 1000 can be improved.

In the present specification, the system represents a whole apparatus configured of a plurality of apparatuses.

It should be noted that the effect described here is only illustrative and not limited, and other effects may be provided.

The embodiments of the present technology are not limited to the above-described embodiments, and variations and modifications may be made without departing from the scope of the present technology.

The present technology may have the following configurations.

(1) An image sensing device, including:
a first P type impurity region;
a first N type impurity region; and
a capacity expansion part including a second P type impurity region, a second N type impurity region, and a PN junction surface, the second P type impurity region and the second N type impurity region forming the PN junction surface,
the first P type impurity region, the first N type impurity region and the capacity expansion part being disposed from an upper surface of a semiconductor substrate in a depth direction.

(2) The image sensing device according to (1) above, further including:
a readout electrode that reads out an accumulated electric charge on one surface opposite to the other surface of the first P type impurity region closer to the second N type impurity region than the one surface, in which
the distance between the capacity expansion part and the readout electrode is larger than the distance between the capacity expansion part and the first N type impurity region.

(3) The image sensing device according to (1) or (2) above, in which the capacity expansion part includes second P type impurity regions and second N type impurity regions, the second P type impurity regions and the second N type impurity regions being alternately disposed.

(4) The image sensing device according to any one of (1) to (3) above, in which the semiconductor substrate is made of silicon, and
the second P type impurity region is formed of a material that fills an interface with silicon with holes by a work function difference.

(5) The image sensing device according to any one of (1) to (4) above, in which the first P type impurity region and the second P type impurity region are layers disposed in different directions.

(6) The image sensing device according to any one of (1) to (5) above, in which the first N type impurity region and the second N type impurity region are layers disposed in different directions.

(7) The image sensing device according to any one of (1) to (6) above, in which the first N type impurity region is configured of an N+ region having a high concentration and an N− region having a low concentration.

(8) The image sensing device according to any one of (1) to (7) above, in which the first N type impurity region is the N− region having a low concentration.

(9) The image sensing device according to (2) above, in which a potential gradient is provided from the capacity expansion part to the readout electrode for reading out the electric charge.

(10) The image sensing device according to any one of (1) to (9) above, in which the second N type impurity region in the capacity expansion part is formed square in a cross-section viewed from a predetermined direction.

(11) The image sensing device according to any one of (1) to (9) above, in which the second P type impurity region in the capacity expansion part is formed curve having a predetermined width in a cross-section viewed from a predetermined direction.

(12) The image sensing device according to any one of (1) to (9) above, in which the second P type impurity region in the capacity expansion part is formed circle having a predetermined width in a cross-section viewed from a predetermined direction.

(13) The image sensing device according to any one of (1) to (12) above, in which the capacity expansion part includes second P type impurity regions and second N type impurity regions, the second P type impurity regions and the second N type impurity regions being disposed alternately, the repeat distance of the second P type impurity region and the second N type impurity region being 1 μm or less.

(14) The image sensing device according to any one of (1) to (13) above, in which a plurality of the image sensing devices share a floating diffusion, and the readout electrode is disposed near the floating diffusion.

(15) An imaging device comprises a first pixel disposed in a substrate. The first pixel may include a first material disposed in the substrate, and a second material disposed in the substrate. A first region of the first material, a second region of the first material, and a third region of the second material form at least one junction. A first lateral cross section of the substrate intersects the at least one junction, and a second lateral cross section of the substrate intersects at least one fourth region of the first material.

(16) The imaging device of (15), wherein the at least one fourth region of the first material occupies a greater amount of surface area in the second lateral cross section than the first region of the first material and the second region of the first material occupy in the first lateral cross section.

(17) The imaging device of (15), further comprising:
an electrode on the substrate to read out electric charge.

(18) The imaging device of (15), wherein the first material is an n-type material, and the second material is a p-type material.

(19) The imaging device of (15), wherein the first material is an n-type material and the second material is an insulating material.

(20) The imaging device of (15), wherein the first lateral cross section is taken closer to a light incident side of the first pixel than the second lateral cross section.

(21) The imaging device of (15), wherein the first material and the second material form a lattice structure in the first lateral cross section.
(22) The imaging device of (21), wherein the first material and the second material are in a checkered pattern.
(23) The imaging device of (21), wherein the first material forms a grid of n columns and m rows in the second material.
(24) The imaging device of (21), wherein the second material forms a grid of n columns and m rows in the first material.
(25) The imaging device of (15), wherein the first material and the second material have linear shapes in the first lateral cross section.
(26) The imaging device of (15), further comprising:
a charge accumulation region disposed in the substrate.
(27) The imaging device of (26), wherein the at least one fourth region of the first material occupies a greater amount of surface area in the second lateral cross section than the first region of the first material and the second region of the first material occupy in the first lateral cross section.
(28) The imaging device of (26), further comprising:
a second pixel,
wherein the first pixel and the second pixel share the charge accumulation region.
(29) The imaging device of (28), further comprising:
a first electrode on the substrate of the first pixel; and
a second electrode on the substrate of the second pixel,
wherein the first electrode and the second electrode readout electric charge from the charge accumulation region.
(30) The imaging device of (29), wherein the first pixel and the second pixel are adjacent to one another and the charge accumulation region is between the first electrode and the second electrode.
(31) The imaging device of (26), further comprising:
a second pixel, a third pixel, and a fourth pixel,
wherein the first pixel, the second pixel, the third pixel, and the fourth pixel share the charge accumulation region.
(32) The imaging device of (31), further comprising:
a first electrode on the substrate of the first pixel;
a second electrode on a substrate of the second pixel;
a third electrode on a substrate of the third pixel; and
a fourth electrode on a substrate of the fourth pixel, wherein the first electrode, the second electrode, the third electrode, and the fourth electrode readout electric charge from the charge accumulation region.
(33) The imaging device of (32), wherein the first pixel, the second pixel, the third pixel and the fourth pixel are in a 2×2 matrix, and the charge accumulation region is at a center portion of the 2×2 matrix.
(34) The imaging device of (33), wherein the charge accumulation region is surrounded by the first electrode, the second electrode, the third electrode and the fourth electrode.

REFERENCE SIGNS LIST

10 Image sensing device
21 P+ region
22 N+ region
23 N− region
24 P+ region
25 P+ region, substrate
300 image sensing device or imaging device
301 N− region
302 N+ region
303 P+ region
310 PN junction capacity expansion part
320, 420 N type impurity region
330, 410 P type impurity region
500 image sensing device or imaging device
501 N− region
600 image sensing device or imaging device
601 P+ equivalent region
610 PN junction capacity expansion part
701 floating diffusion or charge accumulation region
1000 image sensing apparatus or imaging apparatus
1001 lens group
1002 image sensing device or imaging device
1003 DSP
1004 frame memory
1005 display
1006 recording unit
1007 operation unit
1008 power source
1009 bus line

What is claimed is:

1. An imaging device, comprising:
a first pixel disposed in a substrate, the first pixel including:
a first material disposed in the substrate; and
a second material disposed in the substrate,
wherein a first region of the first material, a second region of the first material, and a third region of the second material form at least one junction,
wherein a first lateral cross section of the substrate intersects the at least one junction,
wherein a second lateral cross section of the substrate intersects at least one fourth region of the first material,
wherein the first lateral cross section is taken closer to a light incident side of the substrate than the second lateral cross section,
wherein the at least one fourth region includes a first sub-region and a second sub-region,
wherein the first sub-region has a first impurity concentration lower than a second impurity concentration of the second sub-region,
wherein the first sub-region is closer to the light incident side of the substrate than the second sub-region,
wherein the second lateral cross section intersects the first sub-region or the second sub-region,
wherein the first sub-region and the second sub-region extend in a first direction along entire widths of the first region, the second region, and the third region measured in the first direction,
wherein the first sub-region and the second sub-region are stacked in a second direction perpendicular to the first direction,
wherein a fifth region of the second material contacts sidewalls of the first sub-region and the second sub-region, and
wherein a sixth region of the second material contacts a surface of the second sub-region that is furthest from the light incident side of the substrate.

2. The imaging device of claim 1, wherein the at least one fourth region of the first material occupies a greater amount of surface area in the second lateral cross section than the first region of the first material and the second region of the first material occupy in the first lateral cross section.

3. The imaging device of claim 1, further comprising:
an electrode on the substrate to read out electric charge.

4. The imaging device of claim 1, wherein the first material is an n-type material, and the second material is a p-type material.

5. The imaging device of claim 1, wherein the first material and the second material form a lattice structure in the first lateral cross section.

6. The imaging device of claim 5, wherein portions of the first material form a grid of n columns and m rows in the second material such that, in the first lateral cross section, the second material surrounds four sides of each portion of the first material.

7. The imaging device of claim 5, wherein portions the second material form a grid of n columns and m rows in the first material such that, in the first lateral cross section, the first material surrounds four sides of each portion of the second material.

8. The imaging device of claim 1, wherein portions of the first material and portions of the second material form a checkered pattern in the first lateral cross section such that a 2×2 array of the portions of the first material and the portions of the second material include two directly diagonal adjacent portions of the first material and two directly diagonal adjacent portions of the second material.

9. The imaging device of claim 1, wherein the first material and the second material have linear shapes in the first lateral cross section wherein the linear shapes are rectangles, wherein long sides of each rectangle are in parallel with long sides of a readout electrode or the long sides of each rectangle are orthogonal to the long sides of the readout electrode.

10. The imaging device of claim 1, further comprising: a charge accumulation region disposed in the substrate.

11. The imaging device of claim 10, wherein the at least one fourth region of the first material occupies a greater amount of surface area in the second lateral cross section than the first region of the first material and the second region of the first material occupy in the first lateral cross section.

12. The imaging device of claim 10, further comprising: a second pixel,
wherein the first pixel and the second pixel share the charge accumulation region.

13. The imaging device of claim 12, further comprising:
a first electrode on the substrate of the first pixel; and
a second electrode on the substrate of the second pixel,
wherein the first electrode and the second electrode readout electric charge from the charge accumulation region.

14. The imaging device of claim 13, wherein the first pixel and the second pixel are adjacent to one another and the charge accumulation region is between the first electrode and the second electrode.

15. The imaging device of claim 10, further comprising:
a second pixel, a third pixel, and a fourth pixel,
wherein the first pixel, the second pixel, the third pixel, and the fourth pixel share the charge accumulation region.

16. The imaging device of claim 15, further comprising:
a first electrode on the substrate of the first pixel;
a second electrode on a substrate of the second pixel;
a third electrode on a substrate of the third pixel; and
a fourth electrode on a substrate of the fourth pixel,
wherein the first electrode, the second electrode, the third electrode, and the fourth electrode readout electric charge from the charge accumulation region.

17. The imaging device of claim 16, wherein the first pixel, the second pixel, the third pixel and the fourth pixel are in a 2×2 matrix, and the charge accumulation region is at a center portion of the 2×2 matrix.

18. The imaging device of claim 17, wherein the charge accumulation region is surrounded by the first electrode, the second electrode, the third electrode and the fourth electrode.

19. The imaging device of claim 1, wherein a seventh region of the second material contacts the first region, the second region, and the third region on the light incident side of the substrate.

* * * * *